(12) United States Patent
Takechi et al.

(10) Patent No.: US 10,714,632 B2
(45) Date of Patent: Jul. 14, 2020

(54) ELECTROSTATIC SENSING DEVICE

(71) Applicant: Tianma Japan, Ltd., Kanagawa (JP)

(72) Inventors: Kazushige Takechi, Kanagawa (JP); Shinnosuke Iwamatsu, Yamagata (JP); Yutaka Abe, Yamagata (JP); Yutaka Murakami, Yamagata (JP); Toru Yahagi, Yamagata (JP); Mutsuto Katoh, Yamagata (JP)

(73) Assignee: TIANMA JAPAN, LTD., Kanagawa (JP)

( * ) Notice: Subject to any disclaimer, the term of this patent is extended or adjusted under 35 U.S.C. 154(b) by 38 days.

(21) Appl. No.: 16/221,010

(22) Filed: Dec. 14, 2018

(65) Prior Publication Data
US 2019/0198678 A1 Jun. 27, 2019

(30) Foreign Application Priority Data
Dec. 21, 2017 (JP) ................. 2017-244652

(51) Int. Cl.
*H01L 29/786* (2006.01)
*H01L 29/423* (2006.01)
(Continued)

(52) U.S. Cl.
CPC ........ *H01L 29/78693* (2013.01); *G01R 29/12* (2013.01); *G01R 29/24* (2013.01);
(Continued)

(58) Field of Classification Search
CPC ........ G01R 29/00; G01R 29/12; G01R 29/24; H01L 29/00; H01L 29/40; H01L 29/41; H01L 29/423; H01L 29/42312; H01L 29/42316; H01L 29/4232; H01L 29/42384; H01L 29/66; H01L 29/66007;
(Continued)

(56) References Cited

U.S. PATENT DOCUMENTS 5,773,989 A * 6/1998 Edelman ................. G01N 27/60
257/E21.531
2010/0044711 A1 * 2/2010 Imai .................. H01L 27/14676
257/59

(Continued)

FOREIGN PATENT DOCUMENTS

JP 2012-043411 A 3/2012

*Primary Examiner* — Hoai-An D. Nguyen
(74) *Attorney, Agent, or Firm* — Young & Thompson

(57) ABSTRACT

An electrostatic sensing device includes a sensor oxide semiconductor TFT, and a controller configured to control the sensor oxide semiconductor TFT. The sensor oxide semiconductor TFT includes an oxide semiconductor active layer, a source electrode connected with the oxide semiconductor active layer, a drain electrode connected with the oxide semiconductor active layer, a gate electrode behind the oxide semiconductor active layer, and a gate insulating layer between the gate electrode and the oxide semiconductor active layer The controller is configured to measure a difference from a reference current of a current flowing between the source electrode and the drain electrode, while applying a driving voltage to the gate electrode, and determine polarity of electrostatic charge of the measurement target based on direction of the difference from the reference current.

11 Claims, 17 Drawing Sheets

(51) Int. Cl.
  *G01R 29/24* (2006.01)
  *G01R 29/12* (2006.01)
  *H01L 29/66* (2006.01)

(52) U.S. Cl.
  CPC .. *H01L 29/42384* (2013.01); *H01L 29/66969* (2013.01); *H01L 29/7869* (2013.01); *H01L 29/78648* (2013.01); *H01L 29/78696* (2013.01)

(58) Field of Classification Search
  CPC ... H01L 29/66969; H01L 29/68; H01L 29/76; H01L 29/772; H01L 29/78; H01L 29/786; H01L 29/78603; H01L 29/78645; H01L 29/78648; H01L 29/7869; H01L 29/78693; H01L 29/78696
  USPC .................................. 324/457, 458; 361/207
  See application file for complete search history.

(56) References Cited

U.S. PATENT DOCUMENTS

| | | | |
|---|---|---|---|
| 2012/0043547 A1 | 2/2012 | Kim et al. | |
| 2016/0313458 A1* | 10/2016 | Masuda | G01T 1/247 |
| 2017/0235202 A1* | 8/2017 | Kubo | G02F 1/1503 |
| | | | 359/266 |
| 2019/0280492 A1* | 9/2019 | Haj-Maharsi | H02J 9/062 |

* cited by examiner

ELECTROSTATIC SENSING DEVICE

CROSS-REFERENCE TO RELATED APPLICATIONS

This Non-provisional application claims priority under 35 U.S.C. § 119(a) on Patent Application No. 2017-244652 filed in Japan on Dec. 21, 2017, the entire content of which is hereby incorporated by reference.

BACKGROUND

This disclosure relates to an electrostatic sensing device.

Electrostatic sensing devices (surface potential sensing devices) are used to measure the surface potential of a photoconductor drum or the electrostatic charge of an electronic device being manufactured. The electrostatic sensing devices measure the electric field generated by an electrified object as a measurement target and convert the measured value into a surface potential. A typical electrostatic sensing device includes a sensing electrode and an openable/closable chopper to measure the electric current generated by the electric field from a measurement target and flowing in the sensing electrode.

JP 2012-43411 A discloses a thin film charged body sensor for sensing a motion of a charged body (for example, a finger) which is in contact or not in contact with a panel. JP 2012-43411 A further discloses that the thin film charged body sensor includes an active layer including an oxide semiconductor.

SUMMARY

As described above, measuring an electric condition such as surface potential of an electrified object is required in specific fields.

An aspect of this disclosure is an electrostatic sensing device configured to measure electrostatic charge of a measurement target placed in front of the electrostatic sensing device, the electrostatic sensing device including: a sensor oxide semiconductor TFT; and a controller configured to control the sensor oxide semiconductor TFT. The sensor oxide semiconductor TFT includes: an oxide semiconductor active layer; a source electrode connected with the oxide semiconductor active layer; a drain electrode connected with the oxide semiconductor active layer; a gate electrode behind the oxide semiconductor active layer; and a gate insulating layer between the gate electrode and the oxide semiconductor active layer. The controller is configured to: measure a difference from a reference current of a current flowing between the source electrode and the drain electrode, while applying a driving voltage to the gate electrode; and determine polarity of electrostatic charge of the measurement target based on direction of the difference from the reference current.

It is to be understood that both the foregoing general description and the following detailed description are exemplary and explanatory and are not restrictive of this disclosure.

EMBODIMENTS

Figure 1A:
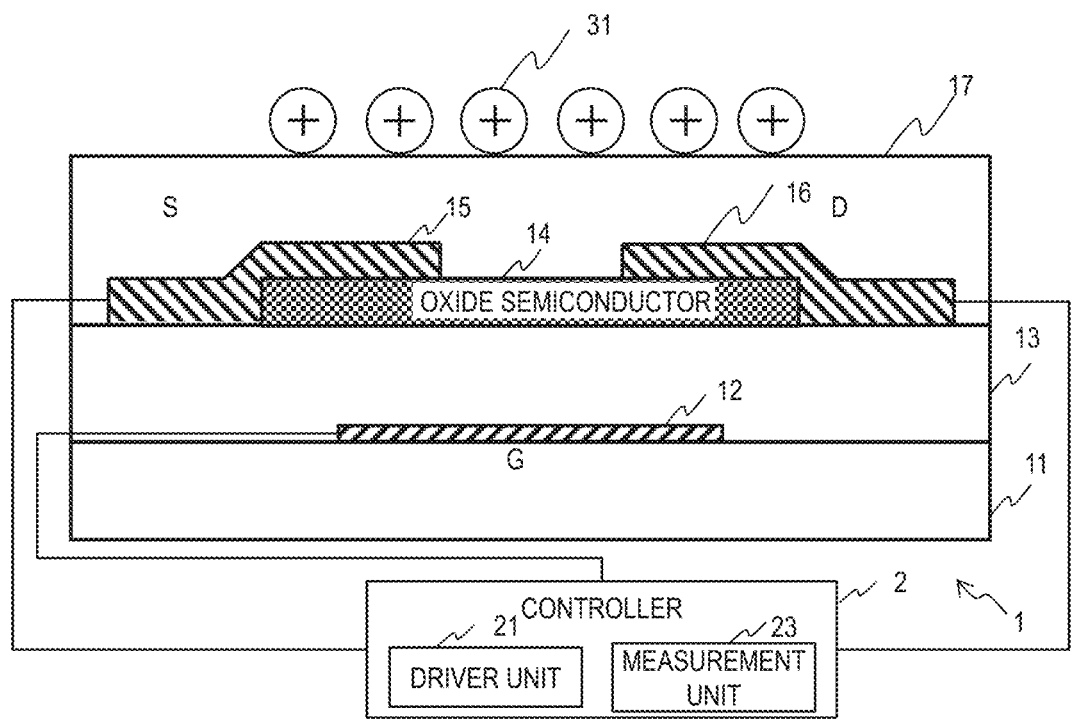
FIG. 1A schematically illustrates a configuration example of an electrostatic sensing device in this disclosure.

Hereinafter, embodiments are described with reference to the accompanying drawings. It should be noted that the embodiments are merely examples to implement this disclosure and are not to limit the technical scope of this disclosure. Elements common to the drawings are denoted by the same reference signs. The elements in the drawings may be exaggerated in size or shape for clear understanding of the description.

Embodiment 1

Figure 1B:
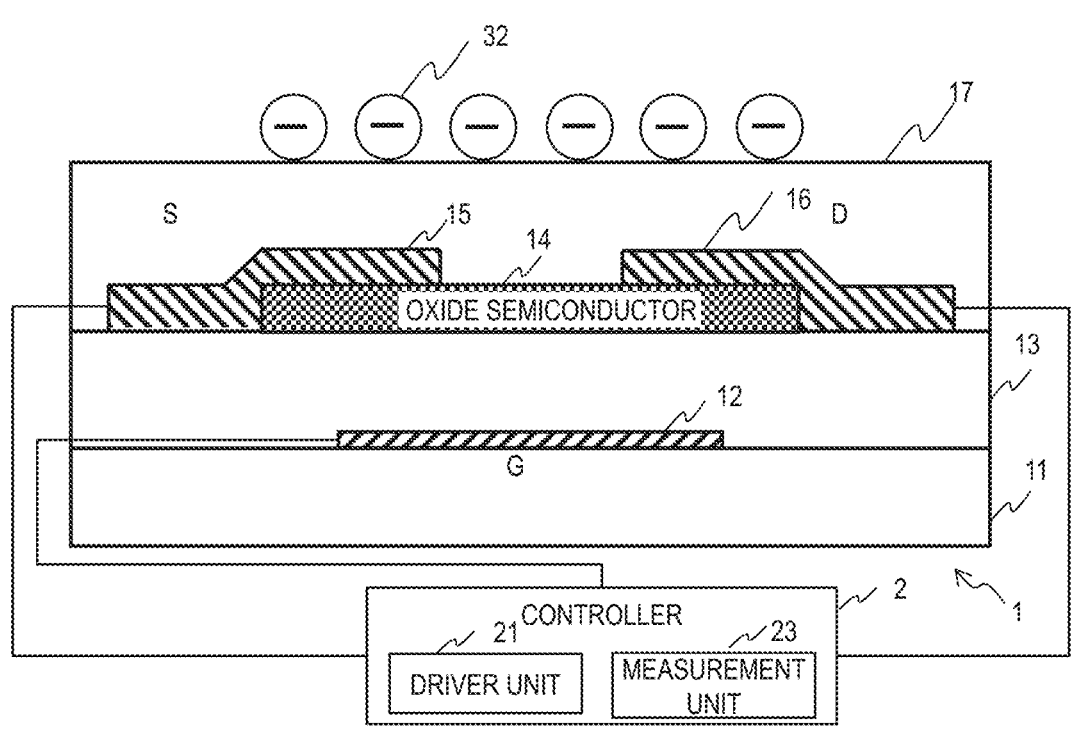
FIG. 1B schematically illustrates a configuration example of an electrostatic sensing device in this disclosure.

FIGS. 1A and 1B schematically illustrate a configuration example of an electrostatic sensing device of this disclosure. The electrostatic sensing device includes a sensor oxide semiconductor TFT 1 formed on an insulating substrate 11 and a controller 2 for controlling the sensor oxide semiconductor TFT 1. The electrostatic sensing device measures the electrostatic charge of a measurement target placed in front of the sensor oxide semiconductor TFT 1.

FIG. 1A schematically illustrates the electrostatic sensing device making a measurement on a measurement target having positive charges 31 and FIG. 1B schematically illustrates the electrostatic sensing device making a measurement on a measurement target having negative charges 32.

In the following description, the side where the measurement target is placed with respect to the sensor oxide semiconductor TFT 1 is referred to as front. In the example of FIGS. 1A and 1B, the opposite side of the sensor oxide semiconductor TFT 1 from the insulating substrate 11 is the front. As to the positional relation of the elements of the sensor oxide semiconductor TFT 1, the side closer to the insulating substrate 11 is referred to as lower side and the opposite side is referred to as upper side.

The sensor oxide semiconductor TFT 1 has a laminated structure. The sensor oxide semiconductor TFT 1 includes a gate electrode 12 formed on the insulating substrate 11, a gate insulating layer (gate insulating film) 13 over the gate electrode 12, and an oxide semiconductor layer 14 above the gate insulating layer 13. The oxide semiconductor layer 14 is a semiconductor active layer (oxide semiconductor active layer) made of an oxide semiconductor.

The example in FIGS. 1A and 1B has a bottom gate structure; the gate electrode 12 is located under the oxide semiconductor layer 14. In other words, the measurement target is placed in front of the oxide semiconductor layer 14 and the gate electrode 12 is located behind the oxide semiconductor layer 14.

The sensor oxide semiconductor TFT 1 further includes a source electrode 15 and a drain electrode 16 formed on the gate insulating layer 13. The source electrode 15 and the drain electrode 16 are connected with the oxide semiconductor layer 14. The source electrode 15 and the drain electrode 16 are formed to be in contact with parts of the top face of the island-like oxide semiconductor layer 14.

The gate insulating layer 13 is formed to fully cover the gate electrode 12. The gate insulating layer 13 is provided between the gate electrode 12 and the oxide semiconductor layer 14, between the gate electrode 12 and the source electrode 15, and between the gate electrode 12 and the drain electrode 16.

A passivation layer (passivation film) 17 is provided over the oxide semiconductor layer 14. In the example of FIGS. 1A and 1B, the passivation layer 17 covers the top face of the oxide semiconductor layer 14 and the top faces of the source electrode 15 and the drain electrode 16.

The insulating substrate 11 is made of glass or resin, for example. The gate electrode 12 is a conductor and can be made of a metal or silicon doped with impurities. The gate insulating layer 13 can be made of thermally oxidized silicon or silicon nitride, for example. Examples of the oxide semiconductor for the oxide semiconductor layer 14 include amorphous InGaZnO (a-InGaZnO) and microcrystalline InGaZnO. In addition to these, oxide semiconductors such as a-InSnZnO, a-InGaZnSnO, and ZnO can be used.

The source electrode 15 and the drain electrode 16 are conductors and can be made of a high melting point metal such as Mo, Ti, or Ta or an alloy thereof. The passivation layer 17 is an inorganic or organic insulator. Although the passivation layer 17 in the example of FIGS. 1A and 1B is a single layer, it can be composed of a plurality of layers as will be described later. In an example, the permittivity of the passivation layer 17 is higher than the permittivity of the gate insulating layer 13. The passivation layer 17 made of a high dielectric material increases the sensitivity of the sensor oxide semiconductor TFT 1.

Figure 1C:
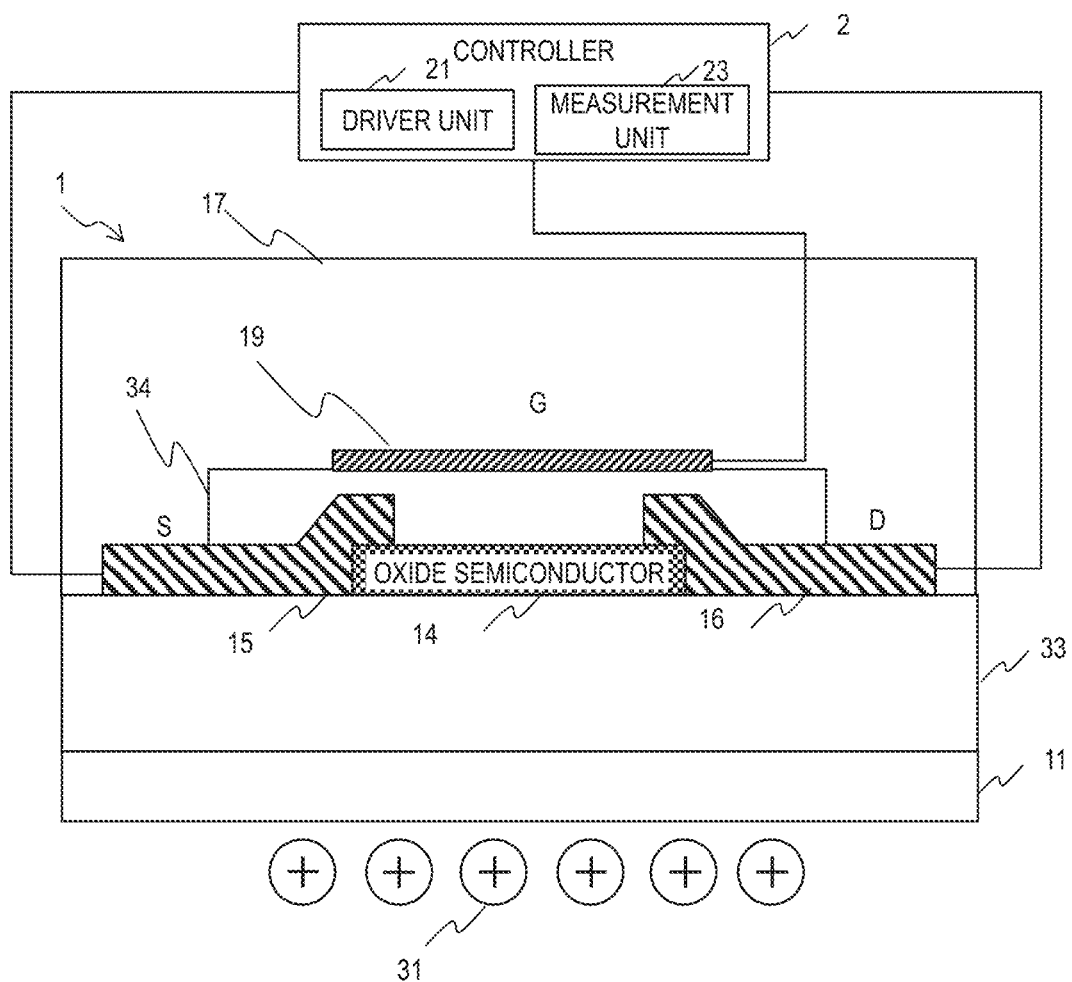
FIG. 1C illustrates an example where a positively charged measurement target is placed in front of a sensor oxide semiconductor TFT.

The configuration example in FIGS. 1A and 1B has a bottom gate structure. Unlike this example, the sensor oxide semiconductor TFT 1 may have a top gate structure. FIG. 1C illustrates a configuration example of a sensor oxide semiconductor TFT 1 having a top gate structure. The sensor oxide semiconductor TFT 1 having a top gate structure has a top gate electrode 19 above the oxide semiconductor layer 14, instead of the bottom gate electrode 12.

An upper gate insulating layer 34 is provided between the top gate electrode 19 and the oxide semiconductor layer 14, between the top gate electrode 19 and the source electrode 15, and between the top gate electrode 19 and the drain electrode 16. The configuration example in FIG. 1C further includes a lower insulating layer 33 between the insulating substrate 11 and the oxide semiconductor layer 14, between the insulating substrate 11 and the source electrode 15, and between the insulating substrate 11 and the drain electrode 16. The insulating substrate 11 and the lower insulating layer 33 made of a high dielectric material increase the sensitivity of the sensor oxide semiconductor TFT 1.

The front of the sensor oxide semiconductor TFT 1 having a top gate structure is the substrate 11. In other words, the measurement target is placed on the opposite side from the top gate electrode 19 across the oxide semiconductor layer 14. FIG. 1C illustrates an example where a positively charged measurement target is placed in front of the sensor oxide semiconductor TFT 1.

The controller 2 is configured to perform predetermined functions with analog circuits and digital circuits. A part of the functions of the controller 2 may be performed by a processor executing a program stored in a memory.

The controller 2 includes a driver unit 21 for driving the sensor oxide semiconductor TFT 1 and a measurement unit 23 for measuring a characteristic value of the sensor oxide semiconductor TFT 1 that varies with the electrostatic charge of the measurement target. The driver unit 21 applies a driving voltage to the gate electrode 12 and applies a driving voltage across the source electrode 15 and the drain electrode 16. The measurement unit 23 measures the electrostatic charge of the measurement target by a predetermined method using a change in the characteristic value.

Specifically, the driver unit 21 provides the sensor oxide semiconductor TFT 1 with a predetermined source-drain voltage Vsd and a predetermined gate voltage Vg. The driver unit 21 maintains the source-drain voltage Vsd and the gate voltage Vg at specified values. The gate voltage Vg can be 0 V. The measurement unit 23 measures the current (source-drain current) Isd flowing between the source electrode 15 and the drain electrode 16 in the sensor oxide semiconductor TFT 1 provided with the predetermined source-drain voltage Vsd and the predetermined gate voltage Vg.

The source-drain current Isd is the current flowing between the source electrode 15 and the drain electrode 16 through the oxide semiconductor layer 14. The part between the source electrode 15 and the drain electrode 16 of the oxide semiconductor layer 14 is referred to as channel. The measurement unit 23 can measure the source-drain current Isd by measuring the current flowing in the source electrode 15 or the drain electrode 16.

The source-drain current Isd in the oxide semiconductor TFT indicates a significant change in response to the static electric field (surface potential) generated by a measurement target placed in front of the oxide semiconductor layer 14 or on the opposite side from the gate electrode 12 across the oxide semiconductor layer 14. The controller 2 can adequately measure the electrostatic charge of the measurement target using a sensor oxide semiconductor TFT 1 having such a characteristic.

The measurement unit 23 measures the reference value of the source-drain current Isd when the sensor oxide semiconductor TFT 1 is not affected by the measurement target. The measurement target is placed in front of the sensor oxide semiconductor TFT 1 at a specific distance. The measurement target may be in contact with or away from the sensor oxide semiconductor TFT 1. Since the measurement result becomes different depending on the distance between the sensor oxide semiconductor TFT 1 and the measurement target, the measurement target is placed at a predetermined distance from the sensor oxide semiconductor TFT 1.

The measurement unit 23 measures the source-drain current Isd in the sensor oxide semiconductor TFT 1 located at a specified place with respect to the measurement target. The measurement unit 23 compares the reference value of the source-drain current Isd with the measured value.

The measured value of the source-drain current Isd is higher or lower than the reference value depending on the polarity of the electrostatic charge of the measurement target. In an example, the measurement unit 23 determines the polarity of the electrostatic charge of the measurement target based on whether the measured value of the source-drain current Isd is higher or lower than the reference value. The measurement unit 23 is provided in advance with relations between the polarity of electrostatic charge and the direction of the difference of the measured value from the reference value. The measurement unit 23 displays the measurement result with a non-illustrated display device.

In another example, the measurement unit 23 measures the intensity of the static electric field generated by the measurement target, inclusive of the polarity of the electrostatic charge of the measurement target. The measurement unit 23 determines the intensity of the static electric field generated by the measurement target based on the direction and the amount of the difference of the measured value of the source-drain current Isd from the reference value. The static electric field intensity may take a positive or negative value representing the polarity and the magnitude of the intensity. The static electric field intensity can be represented by the surface potential of the measurement target. The measurement unit 23 holds in advance information in which the amounts of excess or shortage of the measured value with respect to the reference value (differences between the measured values and the reference value) are associated with static electric field intensities. This information is acquired through measurement of the source-drain current Ids under a plurality of known static electric field intensities (calibration). An amount of excess or shortage represents the direction and the amount of the difference of the measured value from the reference value. The measurement unit 23 displays the measured static electric field intensity with a non-illustrated display device.

As described above, an electrostatic sensor having high sensitivity, high voltage resistance, and high spatial resolving power is attained by using an oxide semiconductor TFT. The electrostatic sensing device of this disclosure measures the electrostatic charge of a measurement target utilizing the change in source-drain current in the oxide semiconductor TFT 1 caused by the electrified measurement target. Hereinafter, the relation between the source-drain current Ids in the oxide semiconductor TFT and the external static electric field is described.

The measured data in FIG. 2A indicates effects of the top gate voltage onto the relation between the source-drain current (hereinafter, drain current) and the bottom gate voltage in an oxide semiconductor TFT having a dual-gate structure. The oxide semiconductor layer of the oxide semiconductor TFT used in the measurement is an a-InGaZnO layer. The source-drain voltage in the measurement is fixed (at 1 V).

An oxide semiconductor TFT having a dual-gate structure includes a top gate electrode above the oxide semiconductor layer and an insulating layer between the top gate electrode and the oxide semiconductor layer, in addition to the structure of the oxide semiconductor TFT 1 illustrated in FIGS. 1A and 1B. The oxide semiconductor layer is sandwiched between the top gate electrode and the bottom gate electrode with the upper and the lower gate insulating layers interposed therebetween.

Figure 2A:
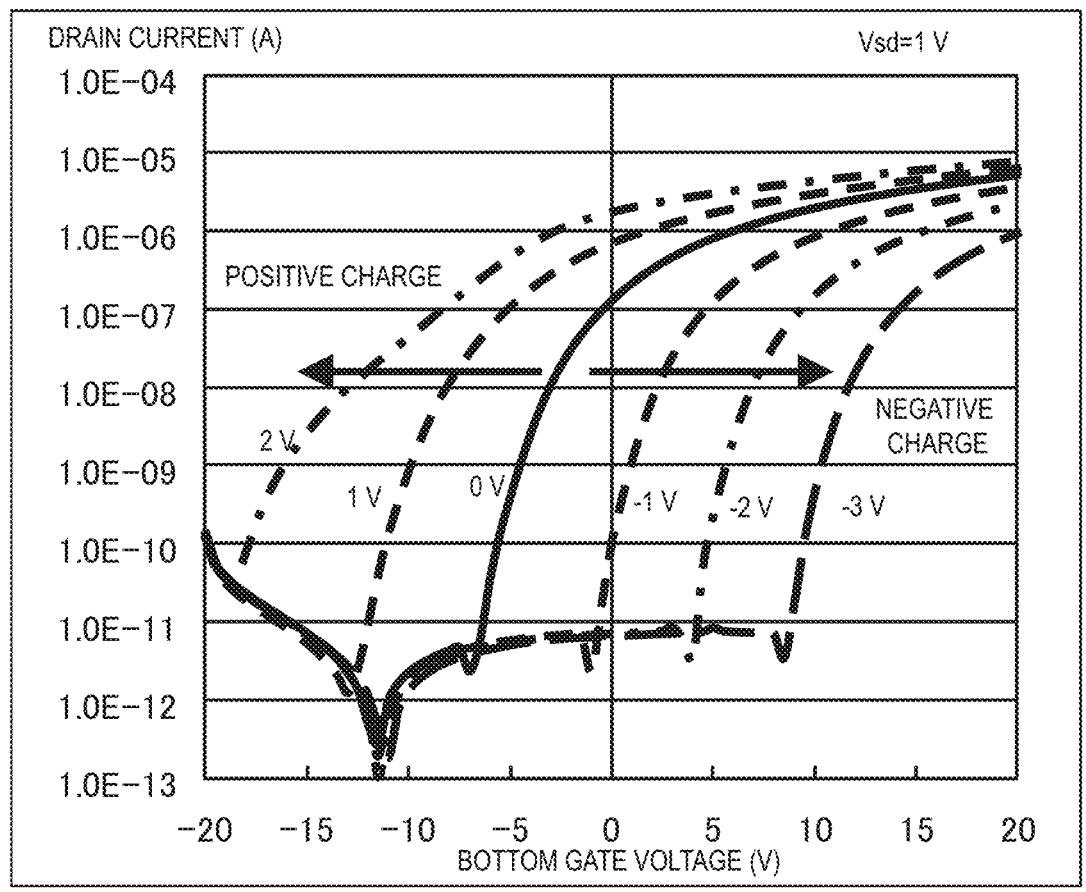
FIG. 2A provides measured data indicating the effects of top gate voltage onto the relation between drain current and bottom gate voltage in an oxide semiconductor TFT having a dual-gate structure.

As indicated in FIG. 2A, the drain current shifts in the negative direction of the bottom gate voltage with increase in the voltage applied to the top gate electrode. The drain current shifts in the positive direction of the bottom gate voltage with decrease in the voltage applied to the top gate electrode.

Applying a positive voltage to the top gate electrode corresponds to placing a positively charged measurement target close to the oxide semiconductor TFT 1 described with reference to FIGS. 1A and 1B.

Contrarily, applying a negative voltage to the top gate electrode corresponds to placing a negatively charged measurement target close to the oxide semiconductor TFT 1.

Figure 2B:
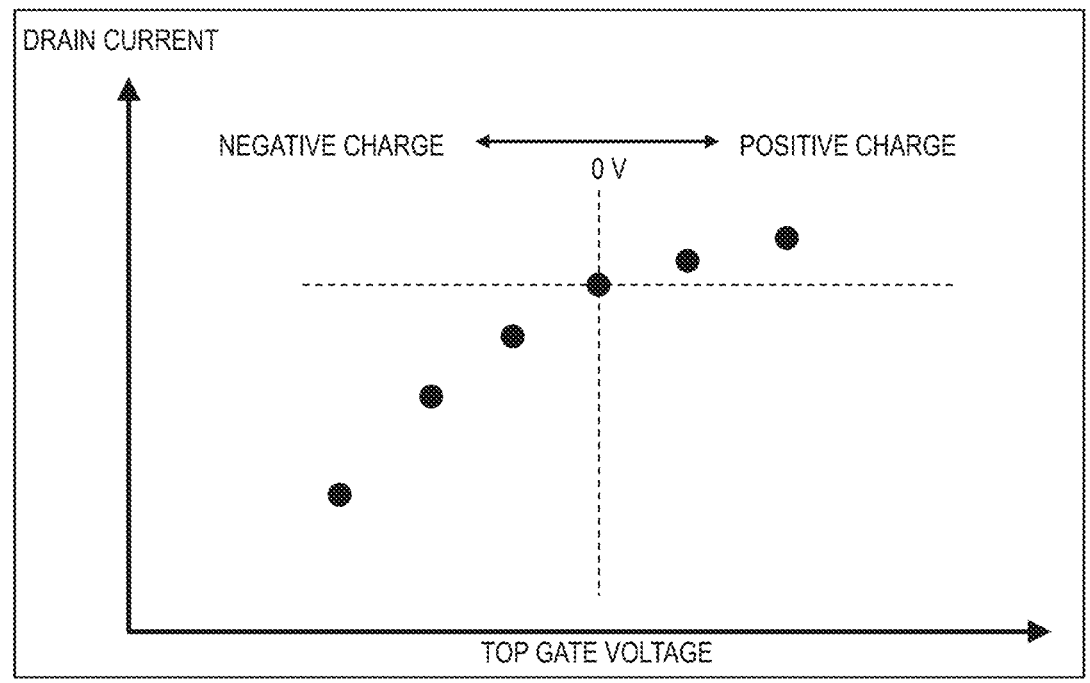
FIG. 2B provides data extracted from FIG. 2A, indicating the relation between the voltage at the top gate electrode and the drain current when the bottom gate voltage is at 12 V.

FIG. 2B provides data extracted from FIG. 2A, indicating the relation between the voltage at the top gate electrode and the drain current when the bottom gate voltage is 12 V. As illustrated in FIG. 2B, the drain current increases/decreases as the top gate voltage increases/decreases. As understood from the above-described characteristics of the oxide semiconductor TFT having a dual-gate structure, when the top gate voltage is 0 V to be the reference value, by associating the value of the drain current with the static electric field intensity, the top gate voltage corresponding to a value of the drain current can be known.

Figure 3:
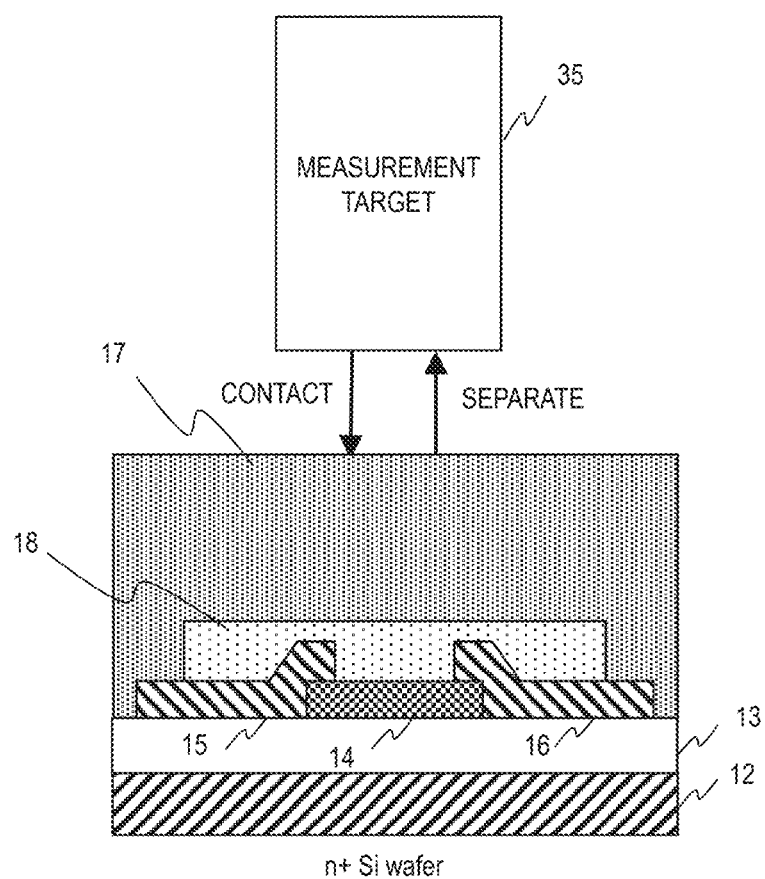
FIG. 3 schematically illustrates a configuration of the sensor oxide semiconductor TFT used in measurement and a measurement target.

Hereinafter, results of measurement of the relation between the electrostatic charge of a measurement target and the drain current using an example of the sensor oxide semiconductor TFT 1 of this disclosure are described. FIG. 3 schematically illustrates a configuration of the sensor oxide semiconductor TFT 1 used in the measurement and a measurement target 35. The sensor oxide semiconductor TFT 1 uses a silicon wafer doped with impurities (n+Si wafer) as a gate electrode 12.

The gate insulating layer 13 is a thermally oxidized silicon film having a thickness of 200 nm. The oxide semiconductor layer 14 is an a-InGaZnO layer having a thickness of 50 nm. The source electrode 15 and the drain electrode 16 are molybdenum films having a thickness of 30 nm. A first passivation layer 18 is provided over the oxide semiconductor layer 14.

The passivation layer 18 covers the entire surface of the oxide semiconductor layer 14, a part of the source electrode 15, and a part of the drain electrode 16. The passivation layer 18 is a tantalum oxide (TaOx) film having a thickness of 100 nm. The permittivity of tantalum oxide is higher than the permittivity of silicon oxide or silicon nitride. In place of tantalum oxide, another high dielectric material such as hafnium oxide (HfOx) or aluminum oxide (AlOx) can be employed.

The sensor oxide semiconductor TFT 1 in this example includes a passivation layer having a double layer structure including the first passivation layer 18 and a second passivation layer 17 provided over the first passivation layer 18. The passivation layer 17 fully covers the oxide semiconductor layer 14, the source electrode 15, the drain electrode 16, and the passivation layer 18. The passivation layer 17 is a dimethylpolysiloxane (PDMS) layer having a thickness of 1 mm. An insulative material different from PDMS can be employed. The sensor oxide semiconductor TFT 1 used in the measurement has a channel width W of 200 µm and a channel length L of 100 µm. The chip size thereof is 10 mm.

An example of the method of fabricating the sensor oxide semiconductor TFT 1 forms a 200-nm thermally oxidized film 13 on a silicon wafer 12 doped with impurities (n+Si wafer). Instead of the thermally oxidized film 13, a silicon oxide film or silicon nitride film may be formed by plasma chemical vapor deposition (CVD) or sputtering.

The method forms a 50-nm oxide semiconductor layer made of a-InGaZnO on the silicon wafer 12 with a thermally oxidized film 13 formed thereon by sputtering through a metal mask. For example, the method forms the oxide semiconductor layer by direct current (DC) sputtering a sintered target made of InGaZnO in the atmosphere of the mixture of argon gas and oxygen gas. After the film formation, the method anneals the wafer in the air and patterns the oxide semiconductor layer to form an island-like oxide semiconductor layer 14.

After forming the oxide semiconductor layer 14, the method forms a source electrode 15 and a drain electrode 16 by DC sputtering through a molybdenum metal mask. Furthermore, the method forms a first passivation layer (TaOx layer) 18 made of tantalum oxide by sputtering through a metal mask. The film formation is made by radio frequency (RF) sputtering a sintered target made of TaO in the atmosphere of the mixture of argon gas and oxygen gas and thereafter, annealing the wafer in the air, for example.

Lastly, the method forms a second passivation layer 17 of PDMS. The method applies PDMS onto the silicon wafer 12 by spin coating to cover all surfaces of the source electrode 15, the drain electrode 16, and the first passivation layer 18 and heats it to cure.

In measuring the drain current in the sensor oxide semiconductor TFT 1, the measurement target 35 was repeatedly moved to contact and separate from the sensor oxide semiconductor TFT 1. Two measurement targets were prepared: one is a positively charged acrylic stick and the other is a negatively charged polytetrafluoroethylene (PTFE) stick. These two measurement targets had charged voltages (surface potentials) of approximately +/−3 kV.

Figure 4A:
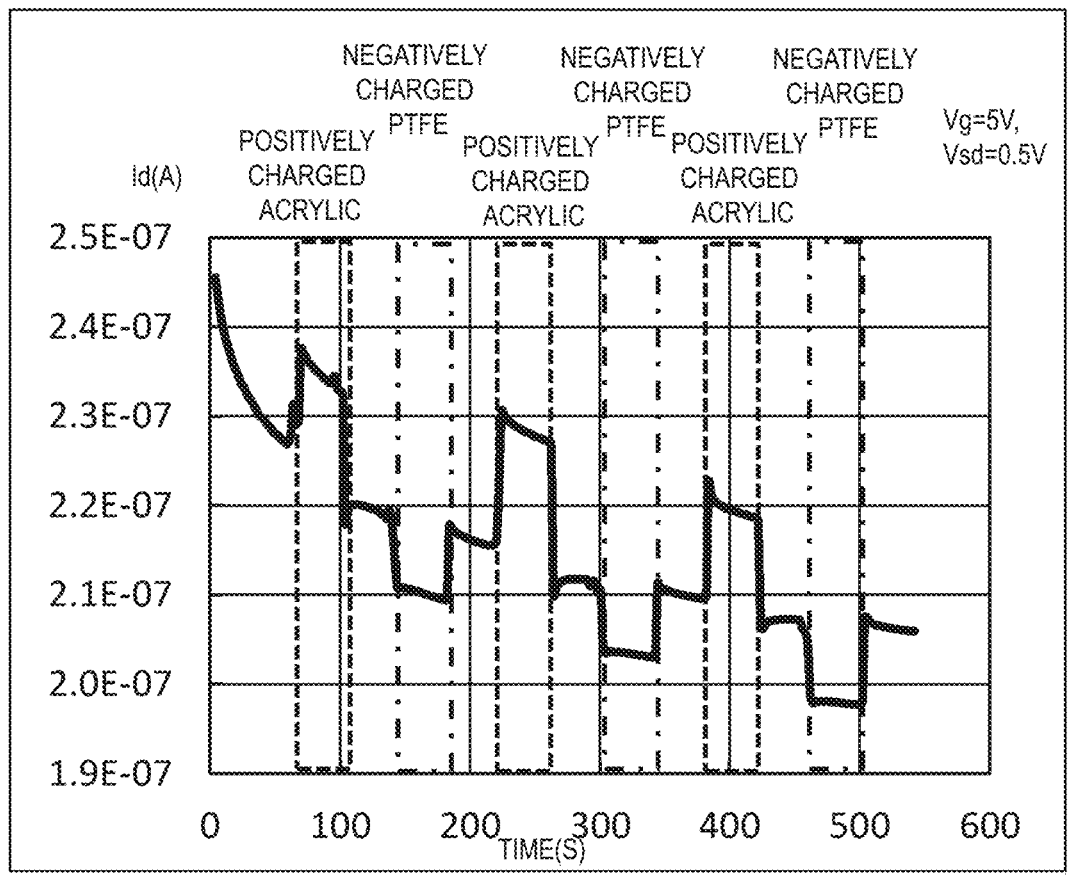
FIG. 4A provides a result of measurement of the drain current Id using a positively charged acrylic stick and a negatively charged PTFE stick.

FIG. 4A provides a result of measurement of the drain current Id (source-drain current Ids) in the case of using the positively charged acrylic stick and the negatively charged PTFE stick. In the measurement, the positively charged acrylic stick and the negatively charged PTFE stick were alternately made to contact the sensor oxide semiconductor TFT 1 for a plurality of times. The intervals between a period in which the acrylic stick is in contact and a period in which the PTFE stick is in contact are periods in which the measurement target is away from the sensor oxide semiconductor TFT 1.

In the graph of FIG. 4A, the horizontal axis represents the time and the vertical axis represents the drain current Id. The gate voltage Vg was fixed at 5 V during the measurement. The reference point of the gate voltage Vg is the source potential. The source-drain voltage Vsd was fixed at 0.5 V during the measurement.

As indicated in FIG. 4A, the reference value of the drain current Id gradually decreased, regardless of whether the measurement target was in contact or not. The reference value of the drain current Id is the drain current Id when the measurement target is away from the sensor oxide semiconductor TFT 1 and the sensor oxide semiconductor TFT 1 is not affected by the external electric field. The temporal variation in reference value of the drain current Id indicated in FIG. 4A is a characteristic unique to the sensor oxide semiconductor TFT 1 used in the measurement.

When the positively charged acrylic stick was in contact with the sensor oxide semiconductor TFT 1, the drain current Id was higher than the reference current value. The amounts of excess were substantially the same among the plurality of times of contact of the acrylic stick. In contrast, when the negatively charged PTFE stick was in contact with the sensor oxide semiconductor TFT 1, the drain current Id was lower than the reference current value. The amounts of shortage were substantially the same among the plurality of times of contact of the PTFE stick. The sensitivity of the sensor oxide semiconductor TFT 1 was approximately 10 nA/3 kV.

Figure 4B:
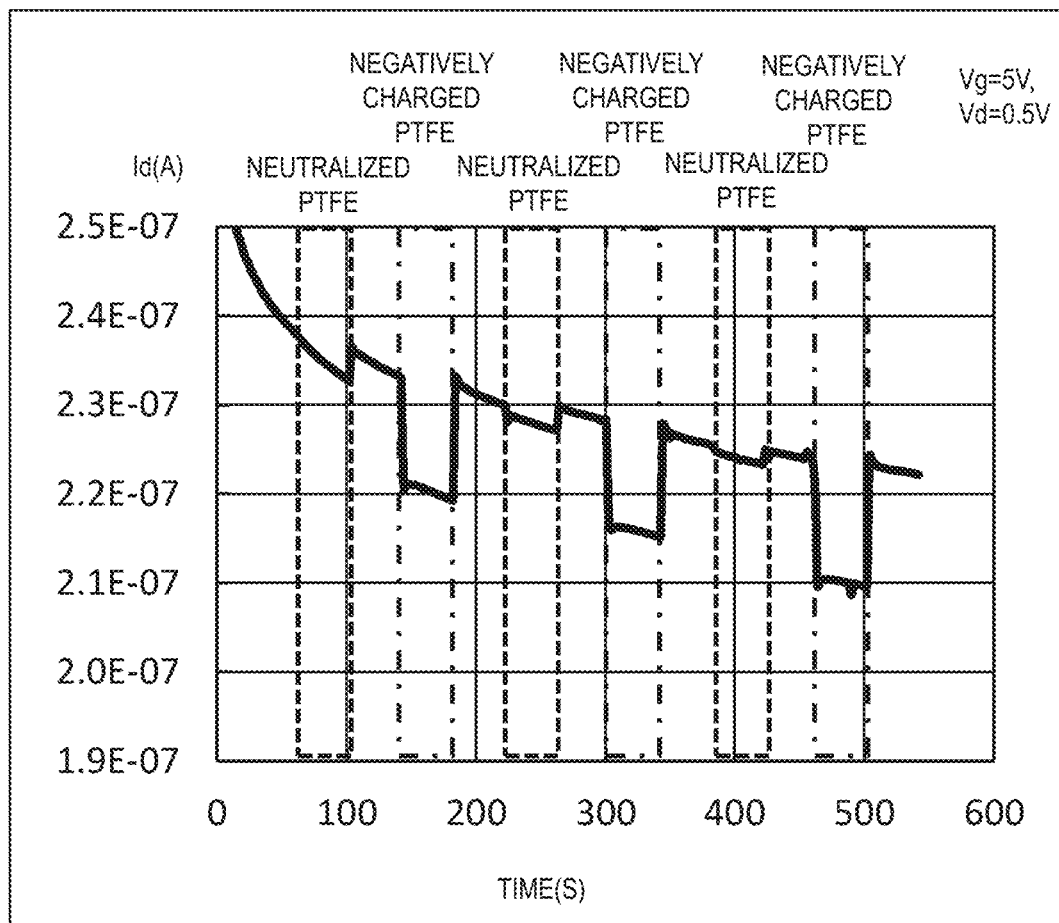
FIG. 4B provides a result of measurement of the drain current Id using a negatively charged PTFE stick and a neutralized PTFE stick.

Next, the variation in drain current Id in the sensor oxide semiconductor TFT 1 was measured using a negatively charged PTFE stick and a neutralized PTFE stick. FIG. 4B provides a result of the measurement. In the measurement, the negatively charged PTFE stick and the neutralized PTFE stick were alternately made to contact the sensor oxide semiconductor TFT 1 for a plurality of times. The intervals between a period in which the negatively charged PTFE stick is in contact and a period in which the neutralized PTFE stick is in contact are periods in which the measurement target is away from the sensor oxide semiconductor TFT 1.

The negatively charged PTFE stick had a charged voltage (surface potential) of approximately −3 kV. The gate voltage Vg was fixed at 5 V during the measurement. The source-drain voltage Vsd was fixed at 0.5 V during the measurement.

As indicated in FIG. 4B, the reference value of the drain current Id gradually decreased, regardless of whether the measurement target was in contact or not. This is the same as the result indicated in FIG. 4A. When the negatively charged PTFE stick was in contact with the sensor oxide semiconductor TFT 1, the drain current Id was lower than the reference current value. In contrast, when the neutralized PTFE stick was in contact with the sensor oxide semiconductor TFT 1, the drain current Id substantially did not indicate a difference from the reference current value.

As understood from the results of measurement in FIGS. 4A and 4B, the source-drain current in the sensor oxide semiconductor TFT 1 indicated excess or shortage from the reference value, depending on the polarity of the charge of the measurement target 35. Specifically, the positively charged measurement target 35 increased the source-drain current and the negatively charged measurement target 35 decreased the source-drain current. Furthermore, the source-drain current in the sensor oxide semiconductor TFT 1 indicated excess or shortage in the amount corresponding to the magnitude of the charged voltage.

The sensor oxide semiconductor TFT 1 used in the measurement includes an oxide semiconductor layer (semiconductor active layer) 14 made of a-InGaZnO. The carriers of the a-InGaZnO layer 13 are electrons and an n-channel is generated. The direction of the difference from the reference current in source-drain current in accordance with the polarity of charge of the measurement target depends on the kind of the carriers. A sensor oxide semiconductor TFT 1 having a p-channel for hole carriers indicates the opposite direction of the difference from the reference current in source-drain current in accordance with the polarity of charge to the direction obtained by the a-InGaZnO sensor oxide semiconductor TFT 1.

Figure 5A:
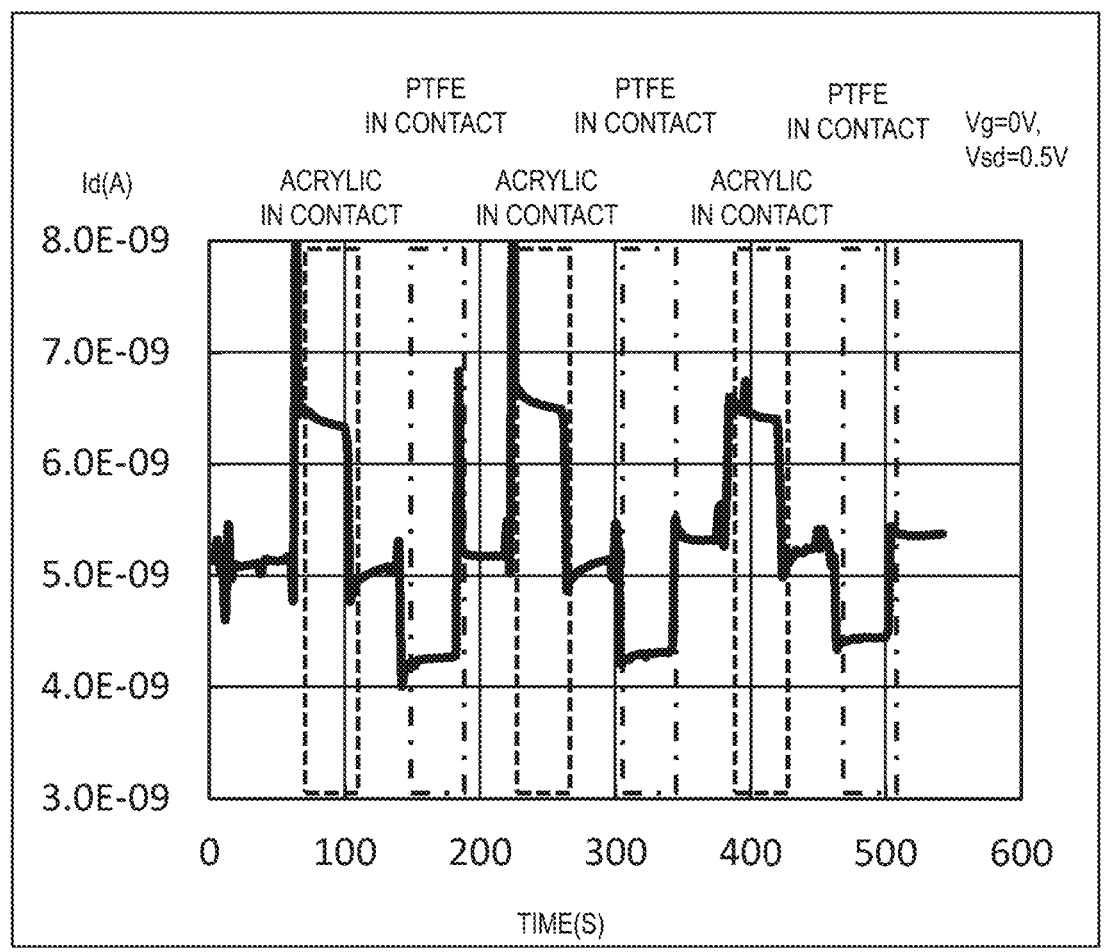
FIG. 5A provides a result of measurement of the drain current Id using a positively charged acrylic stick and a negatively charged PTFE stick.
Figure 5B:
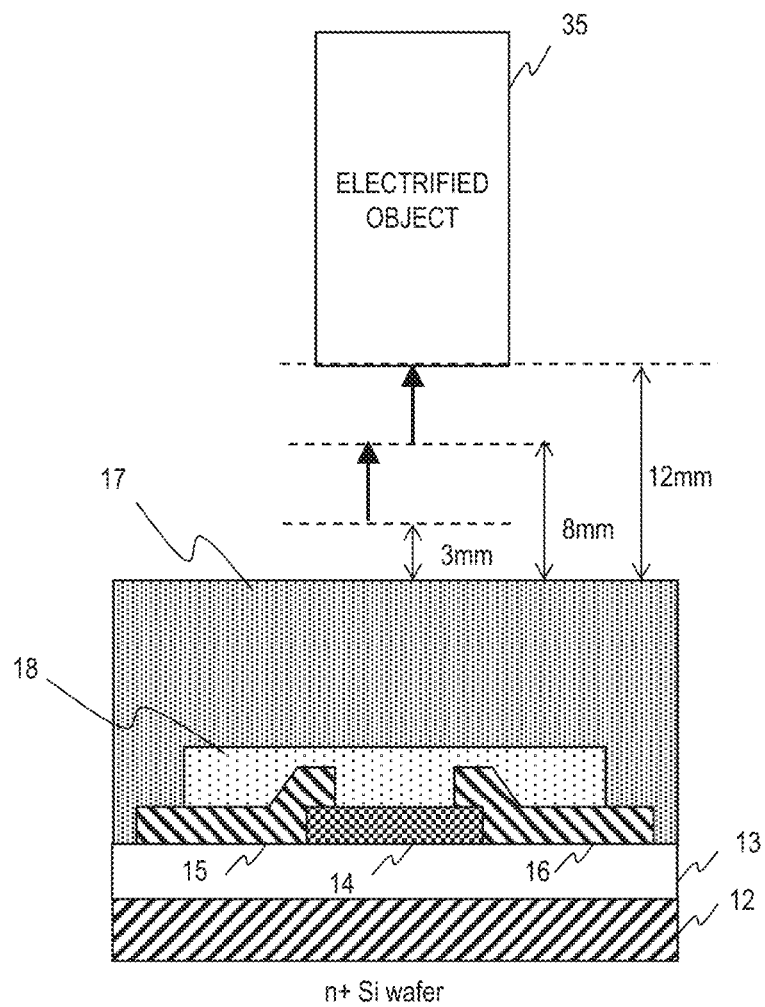
FIG. 5B schematically illustrates a method of measuring the variation in drain current Id when the measurement target is held at different distances from the sensor oxide semiconductor TFT.
Figure 5C:
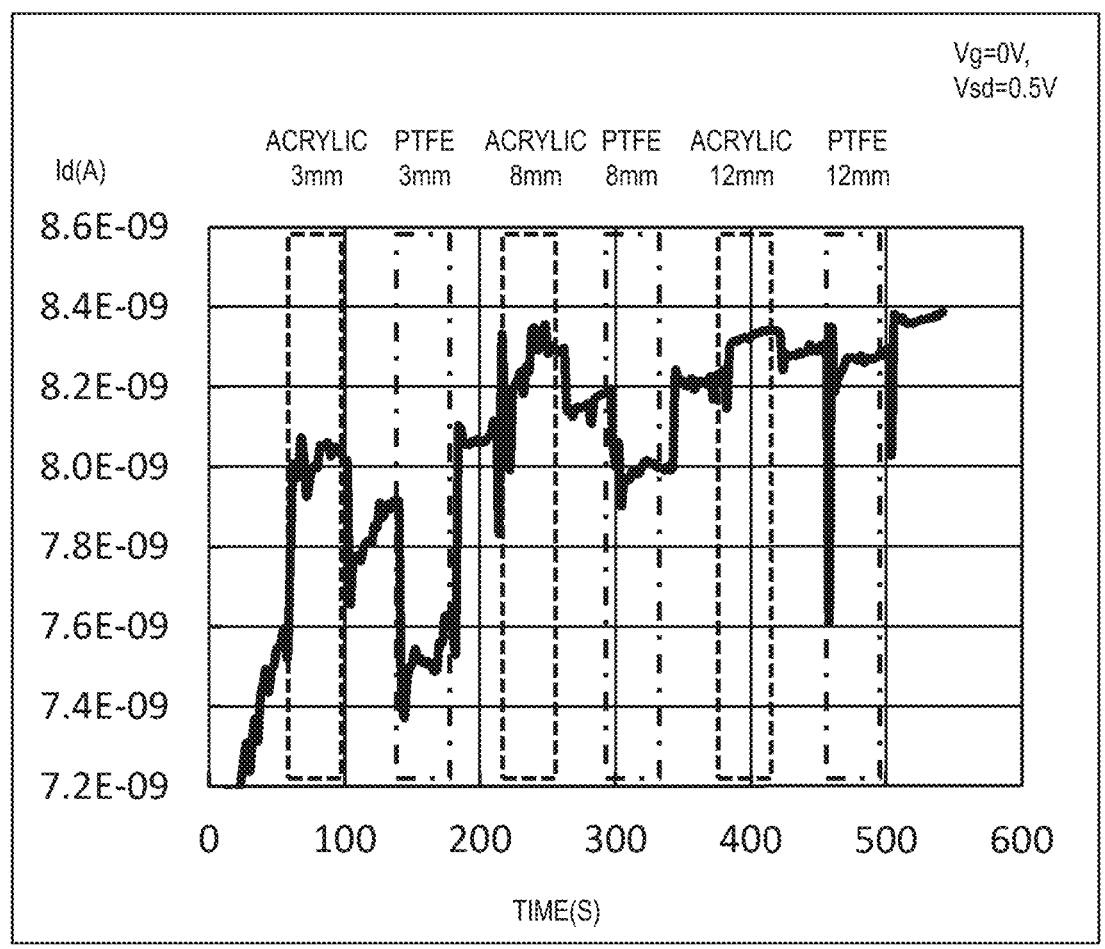
FIG. 5C provides a result of measurement of the variation in drain current Id when the measurement target was held at different distances from the sensor oxide semiconductor TFT.

Next, with reference to FIGS. 5A, 5B, and 5C, other results of measurement with the sensor oxide semiconductor TFT 1 are explained. FIG. 5A provides a result of measurement of the drain current Id using a positively charged acrylic stick and a negatively charged PTFE stick. In the measurement, the positively charged acrylic stick and the negatively charged PTFE stick were alternately made to contact the sensor oxide semiconductor TFT 1 for a plurality of times. The intervals between a period in which the acrylic stick is in contact and a period in which the PTFE stick is in contact are periods in which the measurement target is away from the sensor oxide semiconductor TFT 1.

In the graph of FIG. 5A, the horizontal axis represents the time and the vertical axis represents the drain current Id. The applied gate voltage Vg was fixed at 0 V during the measurement. The source-drain voltage Vsd was fixed at 0.5 V during the measurement. As indicated in FIG. 5A, the reference value of the drain current Id was substantially unchanged.

When the positively charged acrylic stick was in contact with the sensor oxide semiconductor TFT 1, the drain current Id was higher than the reference current value. The amounts of excess were substantially uniform among the plurality of times of contact of the acrylic stick. In contrast, when the negatively charged PTFE stick was in contact with the sensor oxide semiconductor TFT 1, the drain current Id was lower than the reference current value. The amounts of shortage were substantially uniform among the plurality of times of contact of the PTFE stick.

As indicated in FIGS. 4A and 5A, a desired voltage can be selected for the gate voltage Vg for driving the sensor oxide semiconductor TFT 1 so that the drain current Id can be adjusted to meet the configuration of the driver circuit at a later stage. Selecting a low gate voltage Vg yields effects of saving the power consumption.

The variation in drain current Id was further measured when the measurement target was held at different distances from the sensor oxide semiconductor TFT 1, as illustrated in FIG. 5B. FIG. 5C provides the result of the measurement. In the graph of FIG. 5C, the horizontal axis represents the time and the vertical axis represents the drain current Id. The applied gate voltage Vg was fixed at 0 V during the measurement. The source-drain voltage Vsd was fixed at 0.5 V during the measurement.

In measuring the drain current Id, a positively charged acrylic stick and a negatively charged PTFE stick were alternately placed at different distances from the sensor oxide semiconductor TFT 1. The distance from the sensor oxide semiconductor TFT 1 was increased stepwise. The positively charged acrylic stick was placed at distances of 3 mm, 8 mm, and 12 mm from the sensor oxide semiconductor TFT 1 to measure the drain current Id. The negatively charged PTFE stick was also placed at distances of 3 mm, 8 mm, and 12 mm from the sensor oxide semiconductor TFT 1 to measure the drain current Id. The charged voltages of the acrylic stick and the PTFE stick were unchanged and approximately +/−3 kV.

As indicated in FIG. 5C, the reference value of the drain current Id increased with time. This increase is caused by a characteristic of the sensor oxide semiconductor TFT 1. When the positively charged acrylic stick was held at a distance of 3 mm, 8 mm, or 12 mm, the drain current Id was higher than the reference current value. When the distance between the acrylic stick and the sensor oxide semiconductor TFT 1 is longer, the amount of excess in drain current Id was smaller.

In contrast, when the negatively charged PTFE stick was held at a distance of 3 mm, 8 mm, or 12 mm, the drain current Id was lower than the reference current value. When the distance between the PTFE stick and the sensor oxide semiconductor TFT 1 is longer, the amount of shortage in drain current Id was smaller.

As described above, the sensor oxide semiconductor TFT 1 illustrated increase or decrease in drain current in accordance with the polarity of the charge even if the measurement target is distant from the sensor oxide semiconductor TFT 1. The condition that the distance is long means that the intensity of the static electric field from the measurement target onto the oxide semiconductor layer 14 (sensor oxide semiconductor TFT 1) is weak. The sensor oxide semiconductor TFT 1 illustrated variations in drain current of increase/decrease in accordance with increase/decrease in static electric field intensity.

Embodiment 2

Hereinafter, a sensor oxide semiconductor TFT having not only the bottom gate electrode 12 but also an upper electrode (top gate electrode) above the oxide semiconductor layer 14 is described. First, characteristics of an oxide semiconductor TFT having a dual-gate structure are described.

Figure 6A:
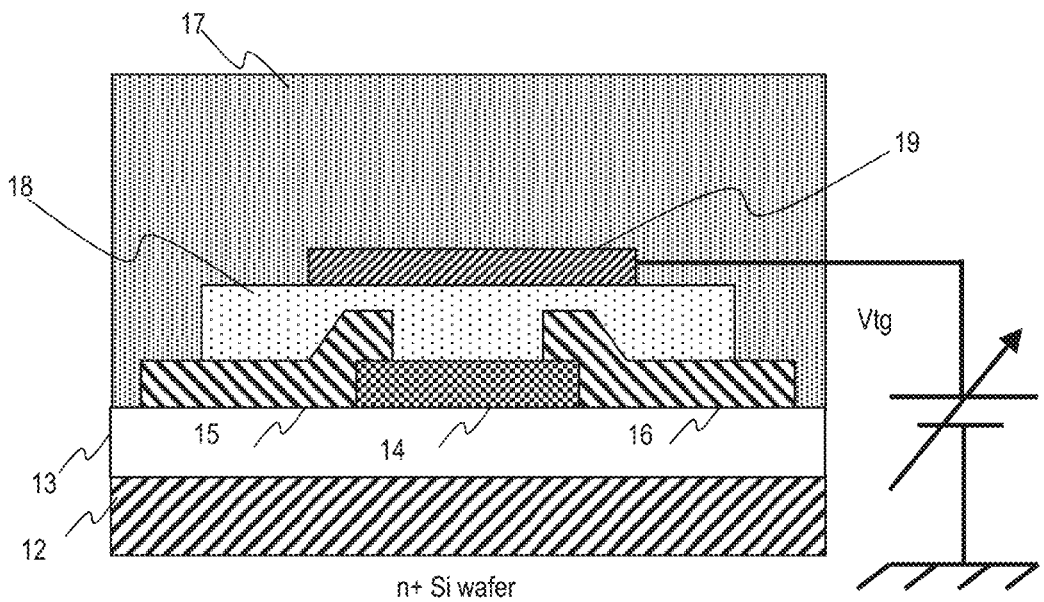
FIG. 6A schematically illustrates a configuration example of an oxide semiconductor TFT having a dual-gate structure used in measurement.

FIG. 6A schematically illustrates a configuration example of an oxide semiconductor TFT having a dual-gate structure used in measurement. The oxide semiconductor TFT has a top gate electrode 19 above the passivation layer 18, in addition to the configuration of the sensor oxide semiconductor TFT 1 illustrated in FIGS. 1A and 1B. The top gate electrode 19 is sandwiched by two passivation layers 17 and 18. The material of the top gate electrode 19 can be the same as the material of the bottom gate electrode 12 or the source/drain electrodes 15/16.

Figure 6B:
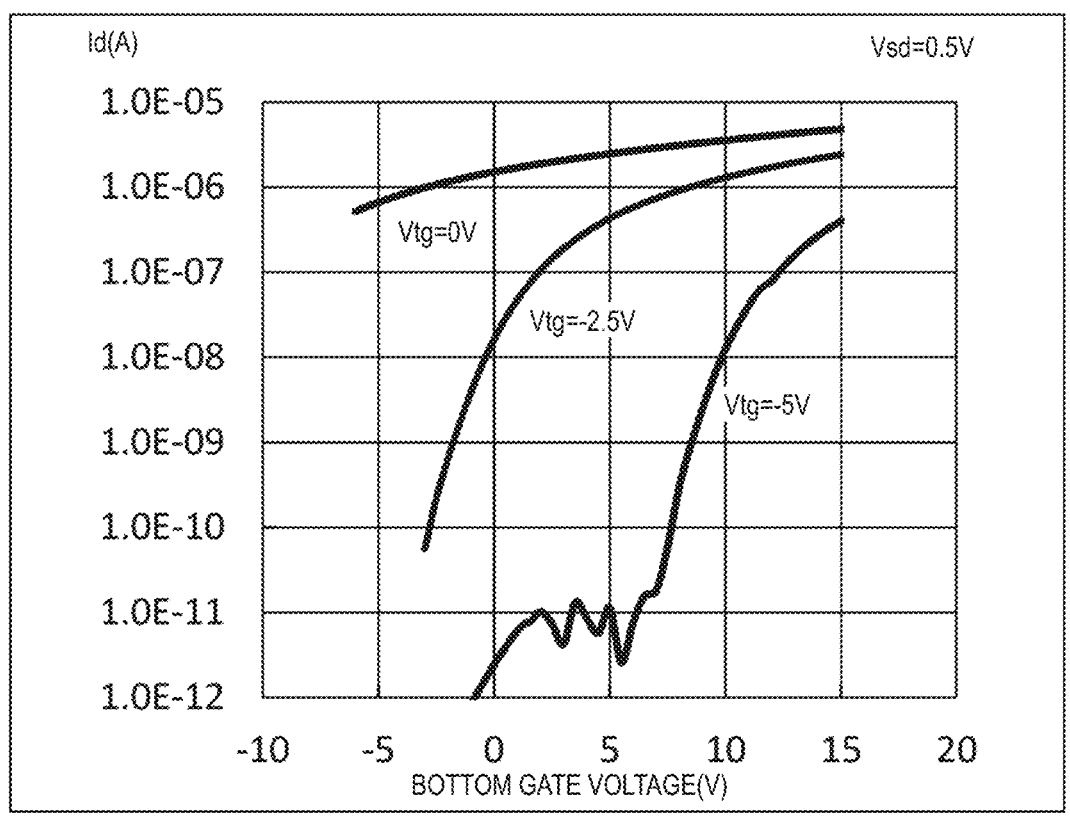
FIG. 6B illustrates the dependency of the relation between the bottom gate voltage and the drain current on the top gate voltage in the oxide semiconductor TFT having a dual-gate structure.

FIG. 6B provides data measured with the oxide semiconductor TFT having a dual-gate structure. FIG. 6B indicates the dependency of the relation between the bottom gate voltage and the drain current (Vbg-Id characteristic) on the top gate voltage (Vtg) in the oxide semiconductor TFT having a dual-gate structure.

The oxide semiconductor TFT used in the measurement has a top gate electrode 19 made of molybdenum in addition to the sensor oxide semiconductor TFT 1 used in the measurement described with reference to FIGS. 3 to 5C.

In the graph of FIG. 6B, the horizontal axis represents the bottom gate voltage and the vertical axis represent the drain current. The source-drain voltage was 0.5 V. FIG. 6B provides relations between the bottom gate voltage and the drain current when the top gate voltage (Vtg) was 0 V, −2.5 V, and −5.0 V.

As indicated in FIG. 6B, the drain current increased with increase in bottom gate voltage. Under the condition of the same bottom gate voltage, when the top gate voltage decreased, the drain current also decreased. The drain current shifted in the positive direction of the bottom gate voltage with decrease in top gate voltage.

Figure 7A:
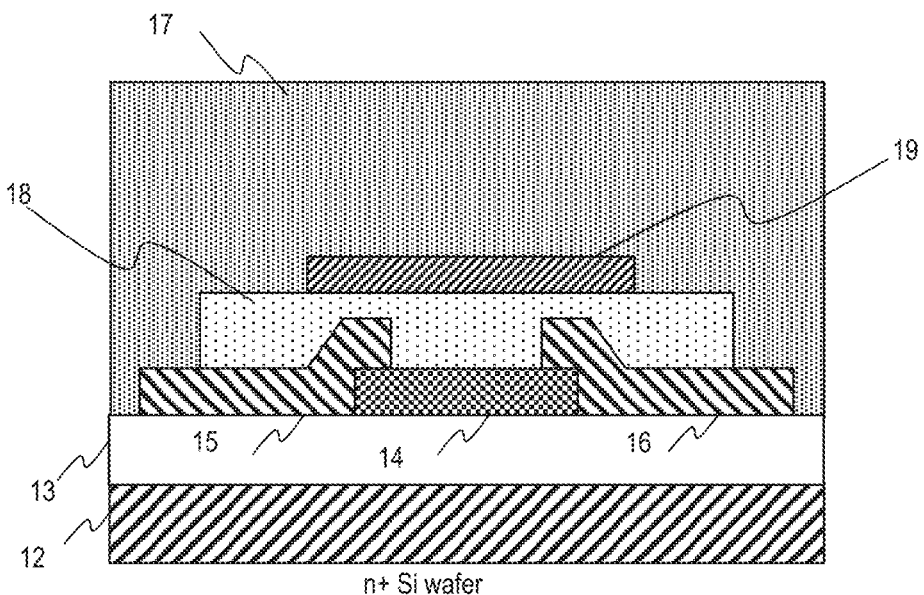
FIG. 7A illustrates a configuration example of an oxide semiconductor TFT having a top gate electrode in a floating state.
Figure 7B:
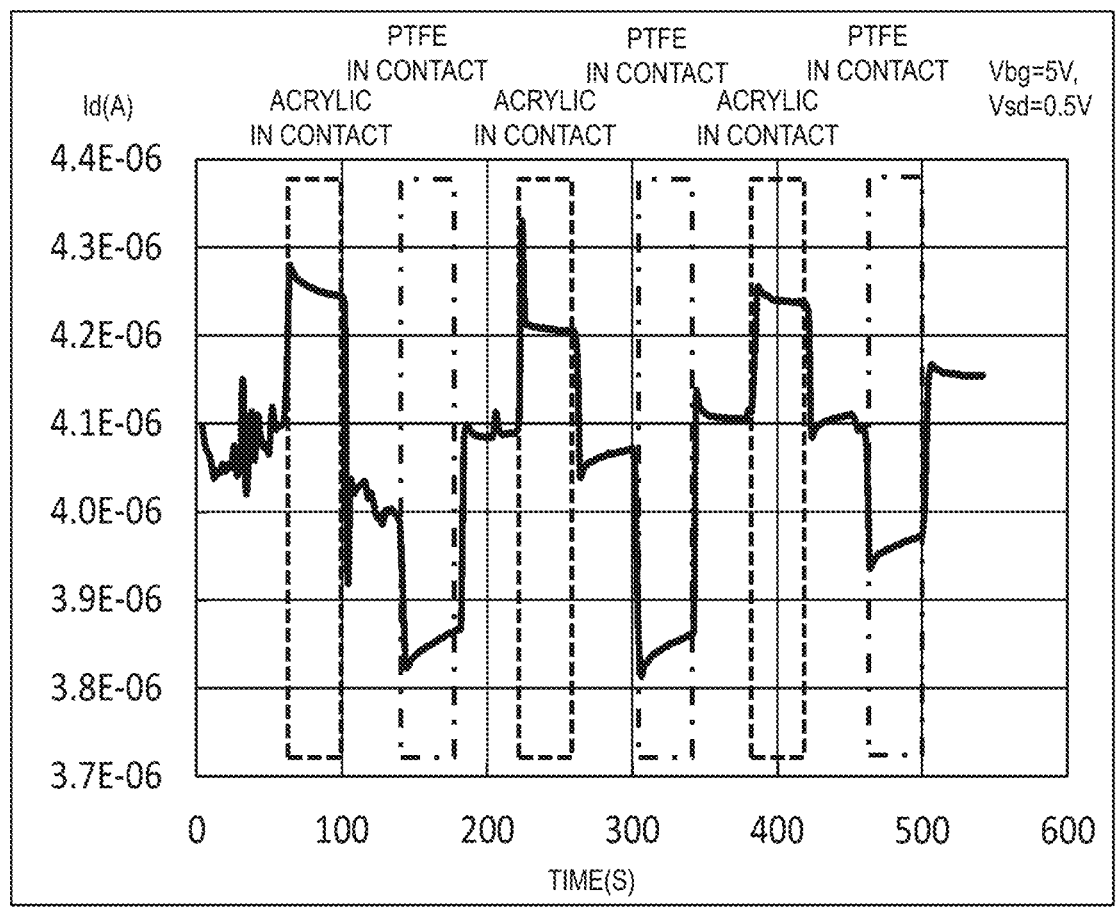
FIG. 7B provides data measured with the oxide semiconductor TFT having a top gate electrode in a floating state.

FIG. 7A schematically illustrates a configuration example of an oxide semiconductor TFT having a top gate electrode 19 in a floating state. The top gate electrode 19 in a floating state is an island-like conductor surrounded by an insulator. FIG. 7B provides data measured with the oxide semiconductor TFT having a gate electrode 19 in a floating state. The configuration of the oxide semiconductor TFT used in the measurement is the same as the oxide semiconductor TFT that provided the measured data in FIG. 6B.

FIG. 7B provides a result of measurement of the drain current Id using a positively charged acrylic stick and a negatively charged PTFE stick. In the measurement, the positively charged acrylic stick and the negatively charged PTFE stick were alternately made to contact the floating top gate sensor oxide semiconductor TFT for a plurality of times. The intervals between a period in which the acrylic stick is in contact and a period in which the PTFE stick is in contact are periods in which the measurement target is away from the sensor oxide semiconductor TFT.

In the graph of FIG. 7B, the horizontal axis represents the time and the vertical axis represents the drain current Id. The applied gate voltage Vg was fixed at 5 V during the measurement. The source-drain voltage Vsd was fixed at 0.5 V during the measurement. As indicated in FIG. 7B, the reference value of the drain current Id was substantially unchanged.

When the positively charged acrylic stick was in contact with the oxide semiconductor TFT, the drain current Id was higher than the reference current value. The amounts of excess were substantially the same among the plurality of times of contact of the acrylic stick. In contrast, when the negatively charged PTFE stick was in contact with the oxide semiconductor TFT, the drain current Id was lower than the reference current value. The amounts of shortage did not indicate a significant difference among the plurality of times of contact of the PTFE stick.

As indicated by the measurement result in FIG. 7B, the oxide semiconductor TFT having a top gate electrode 19 in a floating state indicates a change in drain current in response to an external static electric field. The oxide semiconductor TFT having a top gate electrode 19 in a floating state can work as a sensor oxide semiconductor TFT for measuring the electrostatic charge of a measurement target. The top gate electrode 19 in a floating state works as an antenna for the electrostatic field to change the sensitivity of the sensor oxide semiconductor TFT.

Figure 8A:
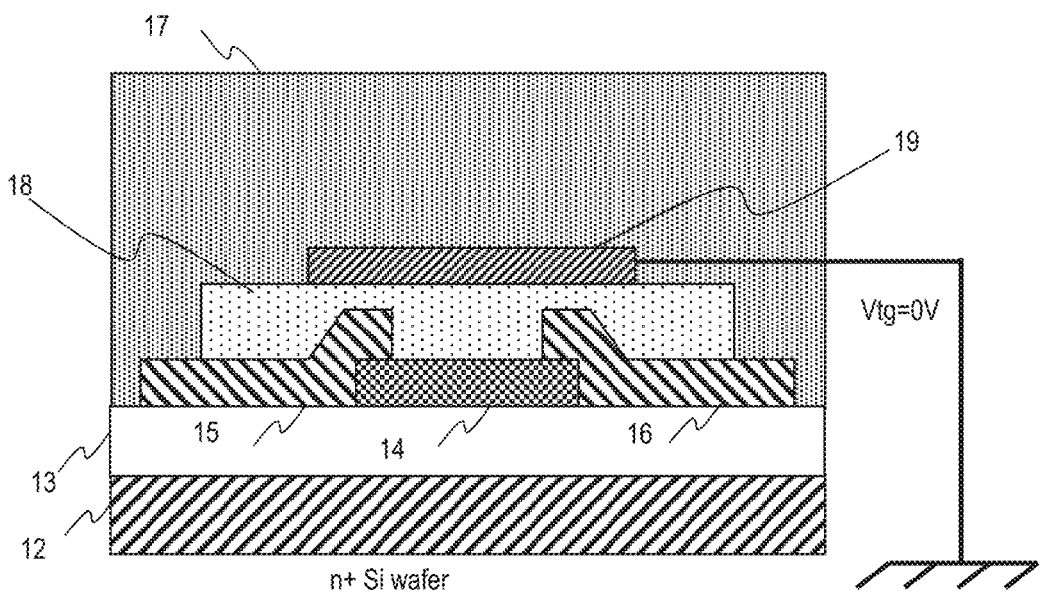
FIG. 8A illustrates a configuration example of an oxide semiconductor TFT having a top gate electrode provided with a driving voltage of 0 V.
Figure 8B:
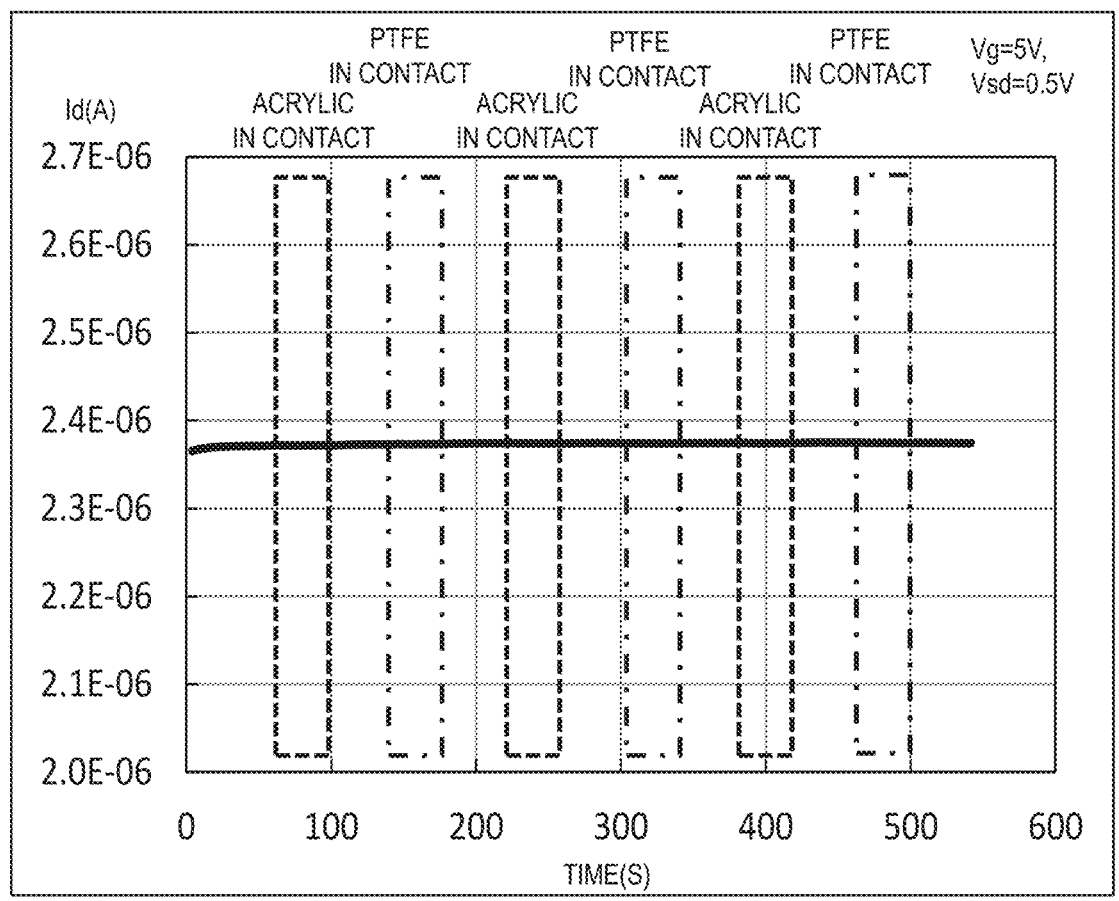
FIG. 8B provides data measured with the oxide semiconductor TFT having a top gate electrode provided with a driving voltage of 0 V.

FIG. 8A schematically illustrates a configuration example of an oxide semiconductor TFT having a top gate electrode 19 provided with a driving voltage of 0 V (grounded). FIG. 8B provides data measured with the oxide semiconductor TFT having a top gate electrode 19 provided with a driving voltage of 0 V. The configuration of the oxide semiconductor TFT used in the measurement is the same as the oxide semiconductor TFT that provided the measured data in FIG. 7B.

FIG. 8B provides a result of measurement of the drain current Id using a positively charged acrylic stick and a negatively charged PTFE stick. In the measurement, the positively charged acrylic stick and the negatively charged PTFE stick were alternately made to contact the sensor oxide semiconductor TFT having a grounded top gate electrode 19 for a plurality of times. The intervals between a period in which the acrylic stick is in contact and a period in which the PTFE stick is in contact are periods in which the measurement target is away from the sensor oxide semiconductor TFT.

In the graph of FIG. 8B, the horizontal axis represents the time and the vertical axis represents the drain current Id. The applied gate voltage Vg was fixed at 5 V during the measurement. The source-drain voltage Vsd was fixed at 0.5 V during the measurement. As indicated in FIG. 8B, the reference value of the drain current Id was unchanged and uniform.

Maintaining the top gate voltage at a fixed value like this example makes the top gate electrode block the electrostatic field to the oxide semiconductor layer to reduce the change in source-drain current in the oxide semiconductor TFT caused by the electrostatic field from the measurement target.

The description of the oxide semiconductor TFT having a dual-gate structure provided with reference to FIGS. 6A to 8B is applicable to an oxide semiconductor TFT on which the control of the top gate electrode and the control of the bottom gate electrode are interchanged. Specifically, a dual-gate oxide semiconductor TFT having a bottom gate electrode 12 in a floating state can be used as electrostatic field sensor oxide semiconductor TFT.

The controller 2 measures the change in source-drain current while applying a fixed top gate voltage Vtg and a fixed source-drain voltage Vsd to measure the electrostatic field generated by a measurement target. The measurement target is placed on the bottom gate electrode side and the bottom gate electrode 12 in a floating state works as an antenna. The controller 2 can apply a fixed voltage to the bottom gate 12 to make the bottom gate electrode 12 work as a shield against the external electrostatic field.

Figure 9A:
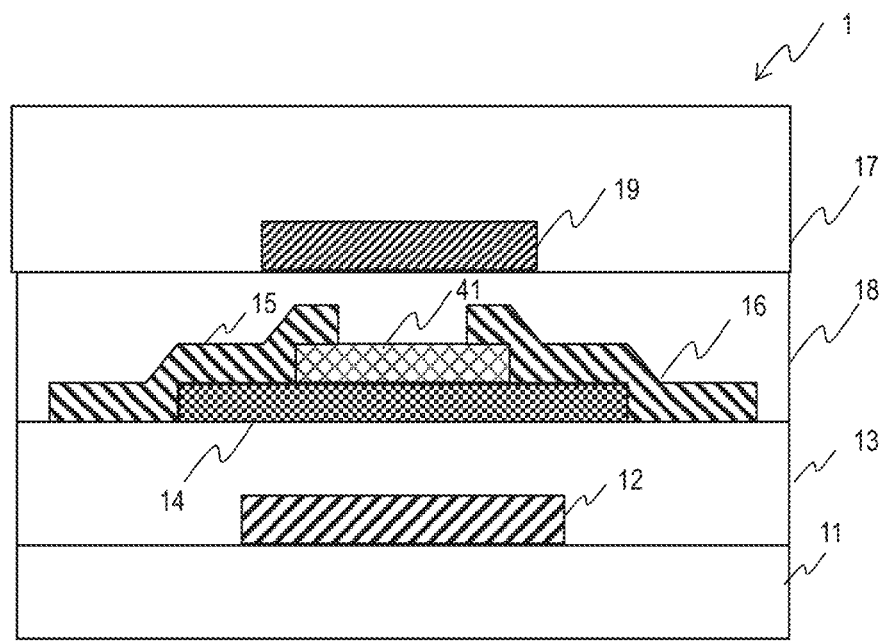
FIG. 9A is a cross-sectional diagram illustrating a configuration example of a sensor oxide semiconductor TFT having a dual-gate structure.

FIG. 9A is a cross-sectional diagram illustrating a configuration example of a sensor oxide semiconductor TFT 1 having a dual-gate structure. The configuration example in FIG. 9A includes an etching stopper layer 41 on the source electrode 15, the drain electrode 16, and the oxide semiconductor layer 14. The etching stopper layer 41 can be made of silicon oxide or silicon nitride. The etching stopper layer 41 covers the oxide semiconductor layer 14 between the source electrode 15 and the drain electrode 16 to prevent effects caused by the formation process of the source electrode 15 and the drain electrode 16 on the oxide semiconductor layer 14.

In the configuration example in FIG. 9A, the first passivation layer 18 is formed to cover the entirety of the oxide semiconductor layer 14, the source electrode 15, the drain electrode 16, and the etching stopper layer 41.

As described above, the top gate electrode 19 in a floating state in the sensor oxide semiconductor TFT 1 works as an antenna for the electrostatic field generated by a measurement target. Upsizing the top gate electrode 19 increases the sensitivity of the sensor oxide semiconductor TFT 1. The designing the sensor oxide semiconductor TFT 1 can adjust the sensitivity of the sensor oxide semiconductor TFT 1 by changing the size of the top gate electrode 19.

Figure 9B:
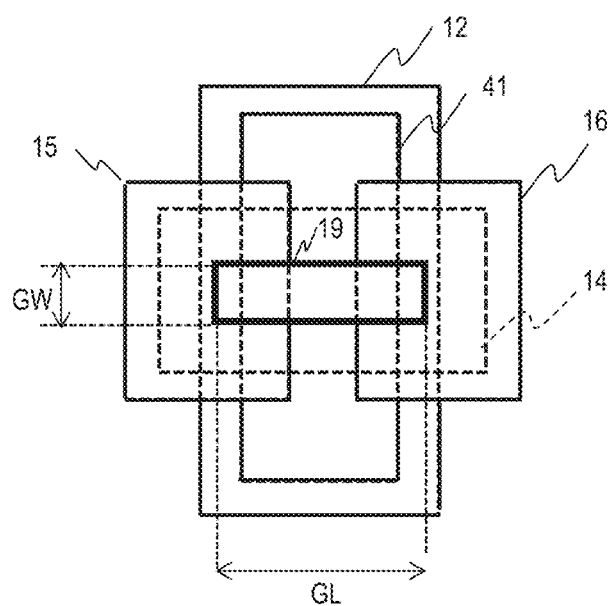
FIG. 9B is a plan diagram illustrating a configuration example of a sensor oxide semiconductor TFT having a top gate electrode.
Figure 9C:
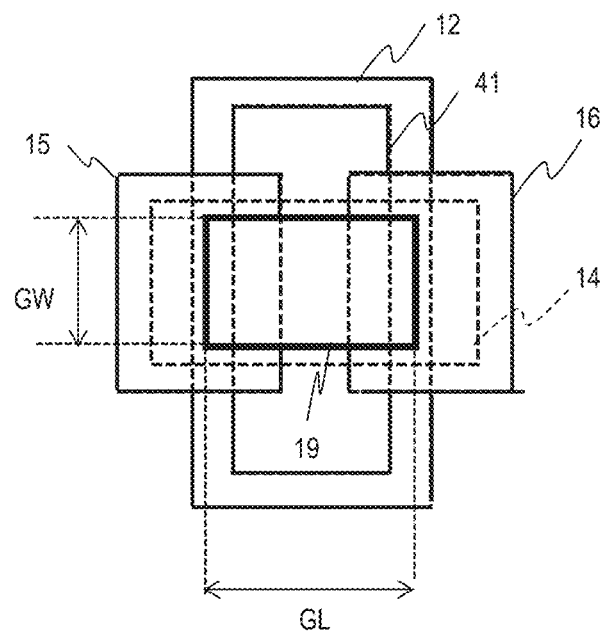
FIG. 9C is a plan diagram illustrating another configuration example of a sensor oxide semiconductor TFT having a top gate electrode.
Figure 9D:
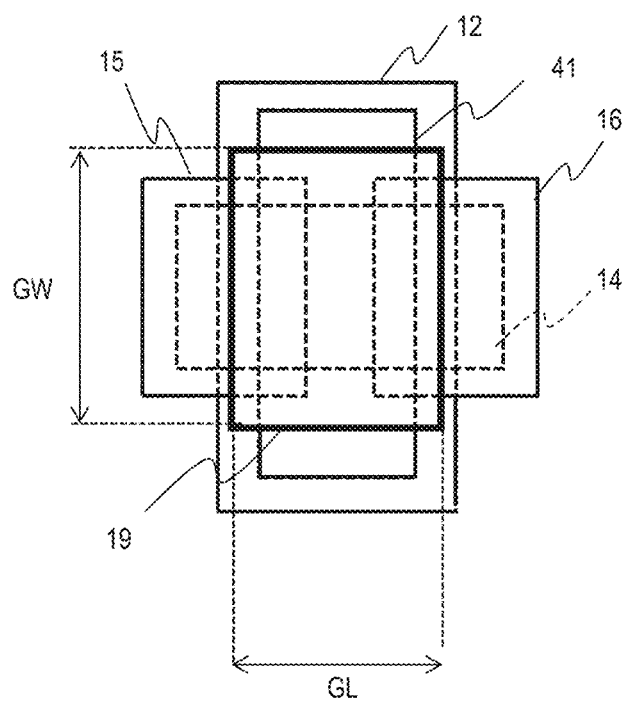
FIG. 9D is a plan diagram illustrating still another configuration example of a sensor oxide semiconductor TFT having a top gate electrode.

FIGS. 9B, 9C, and 9D are plan diagrams illustrating configuration examples of the sensor oxide semiconductor TFT 1 including different sizes of top gate electrodes 19. FIG. 9D illustrates a configuration example including the largest top gate electrode 19 and FIG. 9B illustrates a configuration example including the smallest top gate electrode 19. The lengths GL of the top gate electrodes 19 are the same and the widths GW are different among the configuration examples in FIGS. 9B, 9C, and 9D. The differences in size among the top gate electrodes 19 can be the differences in either or both of the length GL and the width GW.

In the configuration examples of FIGS. 9B, 9C, and 9D, the length GL of the top gate electrode 19 is longer than the length (channel length) of the oxide semiconductor layer 14 between the source electrode 15 and the drain electrode 16. In the configuration examples of FIGS. 9B and 9C, the width GW of the top gate electrode 19 is smaller than the channel width of the oxide semiconductor layer 14. In the configuration example of FIG. 9D, the width GW of the top gate electrode 19 is larger than the channel width of the oxide semiconductor layer 14.

Figure 10A:
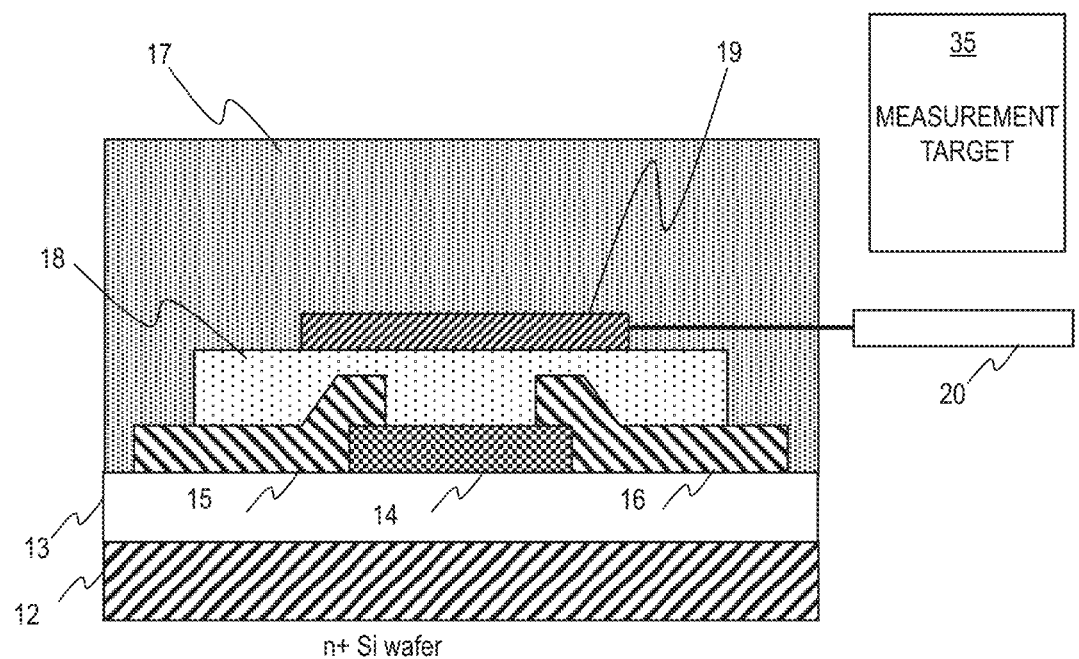
FIG. 10A is a cross-sectional diagram illustrating a configuration example of a sensor oxide semiconductor TFT having a dual-gate structure.

FIG. 10A is a cross-sectional diagram illustrating a configuration example of a sensor oxide semiconductor TFT 1 having a dual-gate structure. The oxide semiconductor TFT has a top gate electrode 19 above the passivation layer 18, in addition to the configuration of the sensor oxide semiconductor TFT 1 illustrated in FIGS. 1A and 1B. The top gate electrode 19 is sandwiched by two passivation layers 17 and 18. The material of the top gate electrode 19 can be the same as the bottom gate electrode 12 or the source/drain electrodes 15/16. The top gate electrode 19 is connected with an antenna electrode 20 on the outside of the sensor oxide semiconductor TFT 1.

The antenna electrode 20 can be a 20-mm or 60-mm square copper-zinc alloy plate. Instead of the copper-zinc alloy plate, a metallic member having any shape can be used. The kind of the metal is not limited to a specific one.

As described above, the top gate electrode 19 in a floating state works in the sensor oxide semiconductor TFT 1 as an antenna for an electrostatic field generated by a measurement target. Connecting an external antenna electrode 20 to the top gate electrode 19 increases the sensitivity of the sensor oxide semiconductor TFT 1. The designing the sensor oxide semiconductor TFT 1 can adjust the sensitivity of the sensor oxide semiconductor TFT 1 by changing the size of the antenna electrode 20.

Figure 10B:
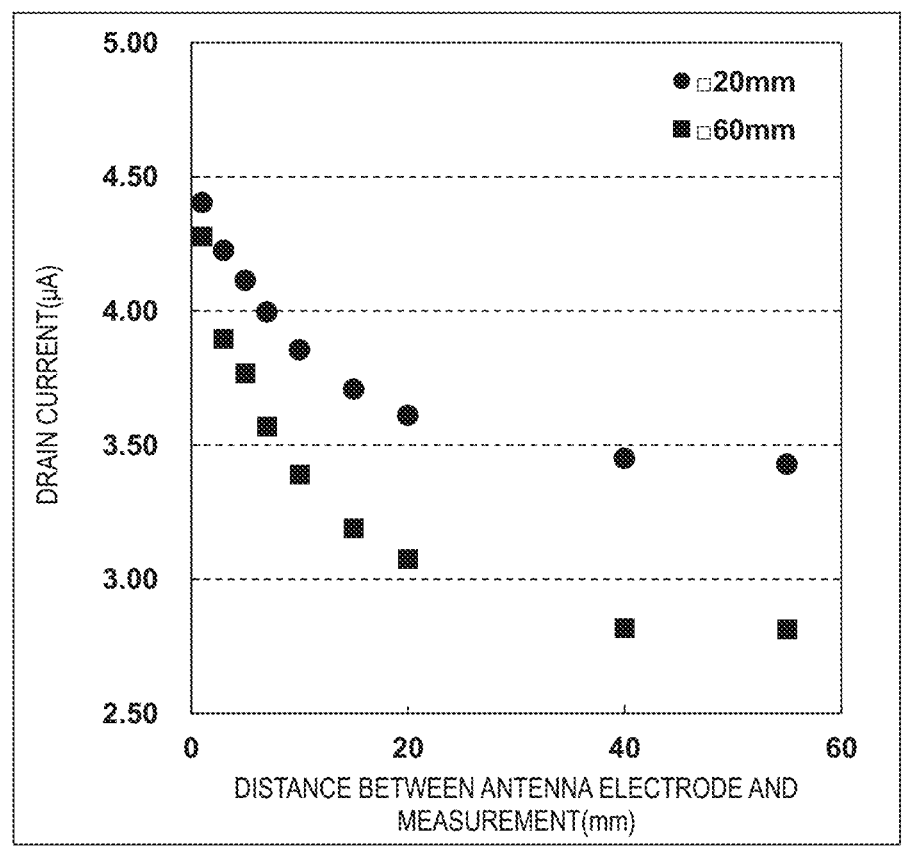
FIG. 10B is a graph indicating results of measurement of the drain current in relation to the distance between the antenna electrode and the measurement target when a sensor oxide semiconductor TFT is connected with different sizes of antenna electrodes.

FIG. 10B provides results of measurement of the drain current Id with the sensor oxide semiconductor TFT 1. The sensor oxide semiconductor TFT 1 was connected with different sizes of antenna electrodes 20 and the measurement target was held at different distances from the antenna electrodes 20. In the graph of FIG. 10B, the horizontal axis represents the distance from the antenna electrode 20 to the measurement target and the vertical axis represents the drain current Id. The applied gate voltage Vg was fixed at 5 V during the measurement and the source-drain voltage Vsd was fixed at 0.5 V during the measurement.

In measuring the drain current Id, a positively charged acrylic stick was held at different distances from the antenna electrode 20. The distance of the acrylic stick from the antenna electrode 20 was increased stepwise as 1 mm, 3 mm, 5 mm, 7 mm, 10 mm, 15 mm, 20 mm, 40 mm, and 55 mm to measure the drain current Id. The charged voltages of the acrylic stick were unchanged and approximately +3 kV.

As indicated in FIG. 10B, when the distance between the acrylic stick and the antenna electrode 20 was longer, the drain current Id was smaller; when the antenna electrode 20 was larger, the variation in drain current Id was larger.

As described above, the sensor oxide semiconductor TFT 1 can sense the electric condition of the measurement target at a distant place with the antenna electrode 20. Increasing the distance between the antenna electrode 20 and the measurement target means the intensity of the electrostatic field from the measurement target decreases at the oxide semiconductor layer 14. The sensitivity of the sensor oxide semiconductor TFT 1 can be adjusted by changing the size of the antenna electrode 20, without changing the configuration of the sensor oxide semiconductor TFT 1.

Embodiment 3

Next, an electrostatic sensor array device including a plurality of planarly arrayed sensor oxide semiconductor TFTs will be described. As described above, a dual-gate oxide semiconductor TFT responds or does not respond to the electrostatic field from a measurement target depending on the condition of the potential of one of the gate electrodes. Utilizing these characteristics of the dual-gate oxide semiconductor TFT, an electrostatic sensor array can be configured with sensor oxide semiconductor TFTs and switch oxide semiconductor TFTs on the same plane.

Figure 11:
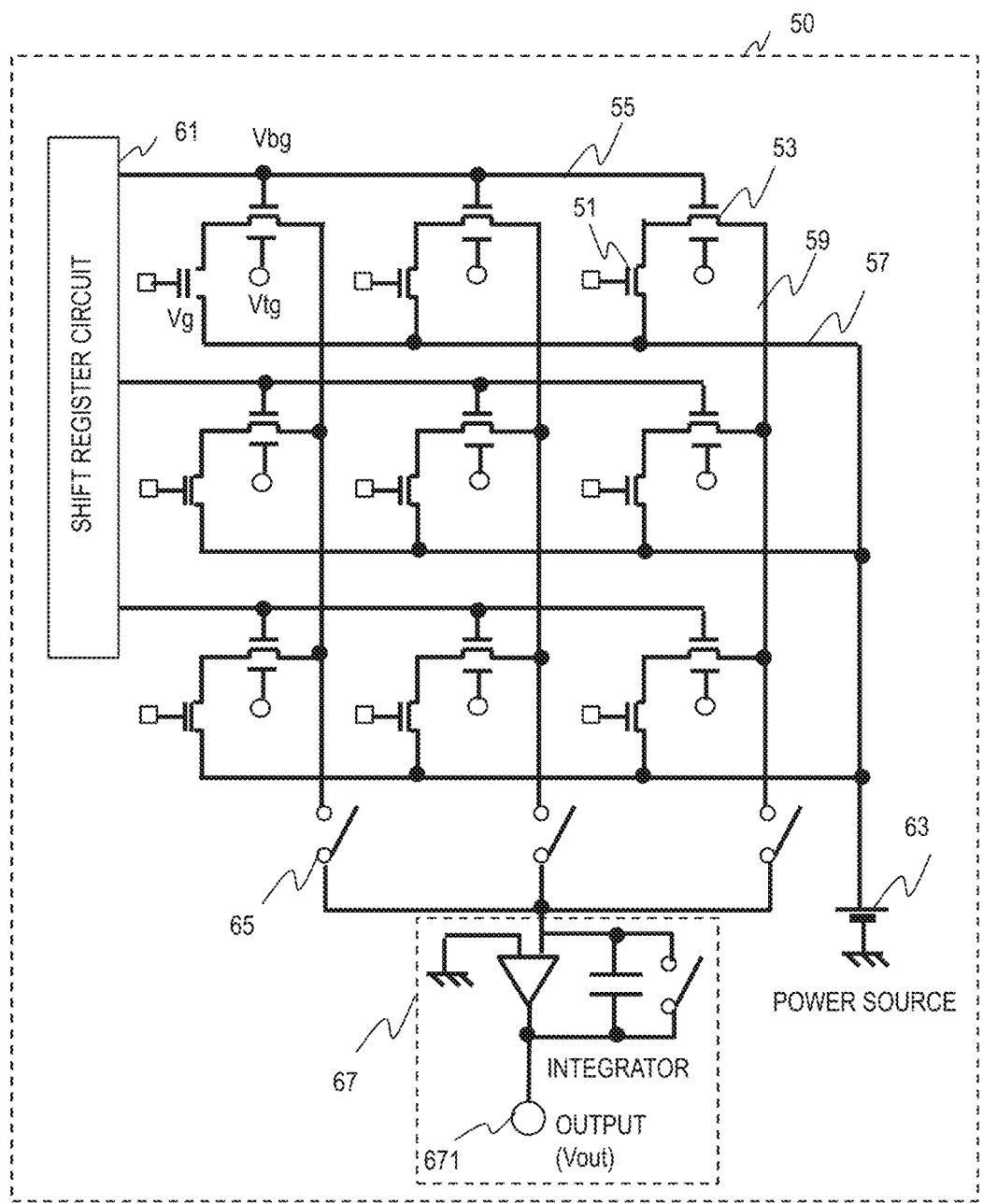
FIG. 11 schematically illustrates a configuration example of an electrostatic sensor array device including two-dimensionally arrayed sensor oxide semiconductor TFTs.

FIG. 11 schematically illustrates a configuration example of an electrostatic sensor array device 50 including two-dimensionally arrayed sensor oxide semiconductor TFTs. The electrostatic sensor array device 50 can speedily measure the electrostatic field intensity at different points in a wide range. In FIG. 11, a part of a plurality of elements of the same kind is indicated with a reference sign and the reference signs for the remaining are omitted.

A plurality of sensor oxide semiconductor TFTs 51 are arrayed in a matrix on a substrate. Each row of sensor oxide semiconductor TFTs 51 corresponds to a row of sensor oxide semiconductor TFTs 51 disposed in the horizontal direction (row direction) in FIG. 11. Each column of sensor oxide semiconductor TFTs 51 corresponds to a column of sensor oxide semiconductors TFT 51 disposed in the vertical direction (column direction) in FIG. 11.

Each sensor oxide semiconductor TFT 51 has a bottom gate structure and does not have a top gate electrode. The sensor oxide semiconductor TFT 51 may have a dual-gate structure having a top gate electrode in a floating state.

A plurality of power lines 57 extending in the row direction are disposed one above the other in the column direction. The plurality of power lines 57 are connected with a power circuit 61. The source or drain of each sensor oxide semiconductor TFT 51 is connected with the power circuit 63 through a power line 57; a fixed driving voltage is applied across the source and the drain. The gate of the sensor oxide semiconductor TFT 51 is provided with a fixed driving voltage from a circuit (not illustrated).

Each sensor oxide semiconductor TFT 51 is connected with a switch oxide semiconductor TFT 53 associated therewith. Specifically, either the source or the drain of the switch oxide semiconductor TFT 53 is connected with the source or the drain of the sensor oxide semiconductor TFT 51. The remaining source or drain of the switch oxide semiconductor TFT 53 is connected with a signal line 59.

A plurality of switch oxide semiconductor TFTs 53 are arrayed in a matrix on the substrate. Each switch oxide semiconductor TFT 53 has a dual-gate structure. The top gate of the switch oxide semiconductor TFT 53 is provided with a fixed voltage from a circuit (not illustrated). The bottom gate is connected with a shift register circuit 61 through a gate line 55.

The elements of the switch oxide semiconductor TFT 53 except for the top gate can be made of the same material as the material of the corresponding elements of the sensor oxide semiconductor TFT 51. For example, the material of the oxide semiconductor layer of the switch oxide semiconductor TFT 53 can be the same as the material of the oxide semiconductor layer of the sensor oxide semiconductor TFT 51. The material of some specific element in the switch oxide semiconductor TFT 53 can be different from the material of the corresponding element in the sensor oxide semiconductor TFT 51.

A plurality of gate lines 55 extending in the row direction are disposed one above the other in the column direction. Each gate line 55 is connected with the shift register circuit 61. The switch oxide semiconductor TFTs 53 in a row are connected with the same gate line 55.

A plurality of signal lines 59 extending in the column direction are disposed side by side in the row direction. The switch oxide semiconductor TFTs 53 in a column are connected with the same signal line 59. Each signal line 59 is connected with an integrator 67 through a switch 65. The integrator 67 includes a switch for clearing output and an output terminal 671, in addition to an operational amplifier, and a capacitor.

The shift register circuit 61, the power circuit 63, the integrator 67, and the switches 65 are included in a controller 2. The controller 2 controls the shift register circuit 61 to select the gate lines 55 one by one. The shift register circuit 61 outputs a selection signal (predetermined gate voltage) to the selected gate line 55. The switch oxide semiconductors TFT 53 connected with the selected gate line 55 become ON.

The controller 2 switches on/off the switches 65 one by one to change the signal line 59 to be connected to the integrator 67. When one gate line 55 is selected and one switch 65 is ON, the switch oxide semiconductor TFT 53 connected with both the gate line 55 and the switch 65 (signal line 59 connected therewith) and the sensor oxide semiconductor TFT 51 associated with the switch oxide semiconductor TFT 53 are selected.

The source-drain current of this sensor oxide semiconductor TFT 51 flows into the integrator 67 via the source and the drain of the associated switch oxide semiconductor TFT 53. The integrator 67 converts the input current to a voltage and outputs it at the output terminal 671. The controller 2 switches off the switch 65 when a predetermined time passes after switching on the switch 65. The controller 2 determines the electric field intensity from the output of the integrator 67 using information associating outputs of the integrator 67 with values of the electric field intensity.

The controller 2 selects the switches 65 to switch them on one by one while selecting one gate line 55. Before selecting the next switch 65, the controller 2 clears the output of the integrator 67. After selecting all switches, the controller 2 selects the next gate line 55.

As described above, the controller 2 controls the shift register circuit 61 and the switches 65 to select the plurality of sensor oxide semiconductor TFTs 51 one by one to measure the source-drain current. Through this operation, the controller 2 measures the electrostatic field intensity at individual points of the two-dimensionally arrayed sensor oxide semiconductor TFTs 51.

Figure 12:
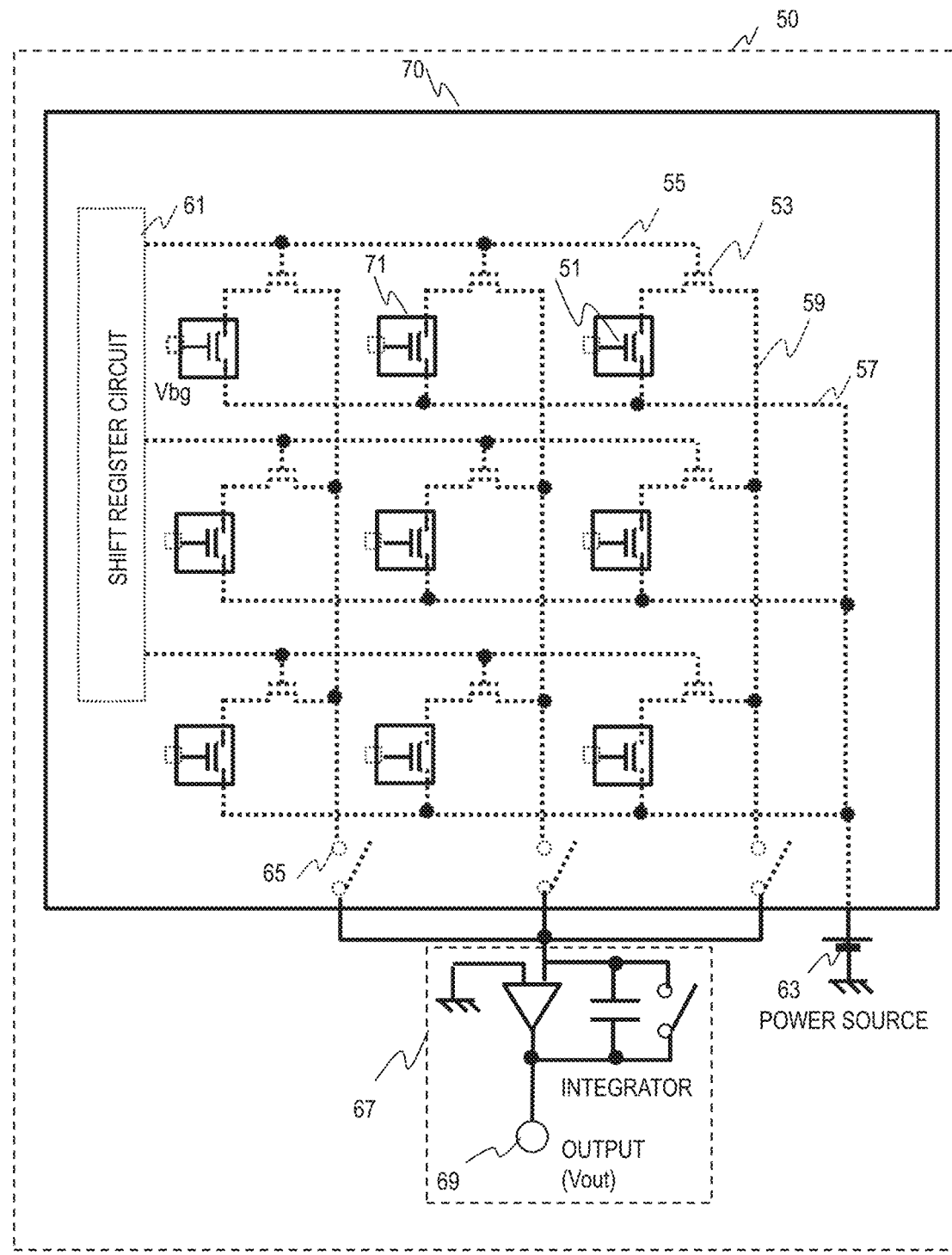
FIG. 12 schematically illustrates another configuration example of an electrostatic sensor array device including two-dimensionally arrayed sensor oxide semiconductor TFTs.

The electrostatic sensor array device 50 can have a different configuration. For example, FIG. 12 provides another configuration example of the electrostatic sensor array device 50. The configuration example in FIG. 12 includes a shield layer (common conductor layer) 70 covering all switch oxide semiconductor TFTs 53 on the front of the switch oxide semiconductor TFTs 53. The shield layer 70 is an unseparated conductor layer; the controller 2 provides a fixed voltage, for example 0 V, to the shield layer 70.

The shield layer 70 is provided on an insulating layer provided in front of the oxide semiconductor layers 14, the source electrodes 15, and the drain electrodes 16. For example, the shield layer 70 can be provided between two passivation layers covering the oxide semiconductor layer 14, the source electrode 15, and the drain electrode 16 of each switch oxide semiconductor TFT 53.

The shield layer 70 blocks the electrostatic field from the measurement target to the switch oxide semiconductors TFT 53. Each switch oxide semiconductor TFT 53 does not need a gate electrode in a floating state and can have a single gate structure. Alternatively, the switch oxide semiconductor TFT 53 can have a dual-gate structure and both of the top gate electrode and the bottom gate electrode can be provided with a driving voltage from the controller 2.

As illustrated in FIG. 12, the shield layer 70 has a plurality of openings 71 each located in front of a sensor oxide semiconductor TFT 51. When seen from the front, each sensor oxide semiconductor TFT 51 is exposed from an opening 71. The static electric field from the measurement target reaches the sensor oxide semiconductor TFT 51 through the opening 71.

The shield layer 70 provided with a fixed voltage and having openings 71 corresponding to the sensor oxide semiconductor TFTs increases the flexibility in designing the switch oxide semiconductor TFTs 53.

In still another configuration example of the electrostatic sensor array device 50, the switch oxide semiconductor TFTs 53 may have a top gate structure. The controller 2 provides each switch oxide semiconductor TFT 53 in the OFF state and the ON state with fixed driving voltages. The top gate electrode provided with a fixed driving voltage blocks the static electric field from the measurement target.

The configuration examples in FIGS. 11 and 12 select one signal line 59 from a plurality of signal lines 59 with a plurality of switches 65. Another configuration example may include a plurality of integrator each connected with one of the plurality of signal lines 59. In this case, the plurality of switches 65 are omitted. The controller 2 can simultaneously measure the drain current of a plurality of selected sensor oxide semiconductor TFTs.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment can be replaced with a configuration of another embodiment or a configuration of an embodiment can be incorporated into a configuration of another embodiment.

What is claimed is:

1. An electrostatic sensing device configured to measure electrostatic charge of a measurement target placed in front of the electrostatic sensing device, the electrostatic sensing device comprising:
   a sensor oxide semiconductor TFT; and
   a controller configured to control the sensor oxide semiconductor TFT,
   wherein the sensor oxide semiconductor TFT includes:
      an oxide semiconductor active layer;
      a source electrode connected with the oxide semiconductor active layer;
      a drain electrode connected with the oxide semiconductor active layer;
      a gate electrode behind the oxide semiconductor active layer; and
      a gate insulating layer between the gate electrode and the oxide semiconductor active layer, and
   wherein the controller is configured to:
      measure a difference from a reference current of a current flowing between the source electrode and the drain electrode, while applying a driving voltage to the gate electrode; and
      determine polarity of electrostatic charge of the measurement target based on direction of the difference from the reference current.

2. The electrostatic sensing device according to claim 1, wherein the controller is configured to determine intensity of an electrostatic field generated by the electrostatic charge of the measurement target based on the direction and amount of the difference.

3. The electrostatic sensing device according to claim 1, wherein the sensor oxide semiconductor TFT further includes:
   a conductor layer in a floating state in front of the oxide semiconductor active layer; and
   an insulating layer between the conductor layer and the oxide semiconductor active layer.

4. The electrostatic sensing device according to claim 1, wherein material of the oxide semiconductor active layer is InGaZnO.

5. The electrostatic sensing device according to claim 1, wherein the sensor oxide semiconductor TFT is provided on a substrate, and
   wherein the gate electrode is provided between the oxide semiconductor active layer and the substrate.

6. The electrostatic sensing device according to claim 1, further comprising a second oxide semiconductor TFT configured to work as a switch,
   wherein the second oxide semiconductor TFT includes:
      a second oxide semiconductor active layer;
      a second source electrode connected with the second oxide semiconductor active layer;
      a second drain electrode connected with the second oxide semiconductor active layer;
      a third electrode in front of the second oxide semiconductor active layer; and
      a second insulating layer between the third electrode and the second oxide semiconductor active layer, and
   wherein the controller is configured to apply a predetermined voltage to the third electrode in measuring the electrostatic charge of the measurement target.

7. The electrostatic sensing device according to claim 6, wherein the second oxide semiconductor TFT further includes:
   a second gate electrode behind the second oxide semiconductor active layer; and
   a second insulating layer between the second gate electrode and the second oxide semiconductor active layer, and
   wherein the controller is configured to apply a predetermined voltage to the third electrode in measuring the electrostatic charge of the measurement target.

8. An electrostatic sensing device configured to measure electrostatic charge of a measurement target placed in front of the electrostatic sensing device, the electrostatic sensing device comprising:
   a plurality of sensor oxide semiconductor TFTs arrayed on a substrate;
   a plurality of switch oxide semiconductor TFTs on the substrate, the plurality of switch oxide semiconductor TFT each configured to select one of the plurality of sensor oxide semiconductor TFTs; and
   a controller configured to control the plurality of sensor oxide semiconductor TFTs and the plurality of switch oxide semiconductor TFTs,
   wherein each of the plurality of sensor oxide semiconductor TFTs includes:
      a first oxide semiconductor active layer;
      a first source electrode connected with the first oxide semiconductor active layer;
      a first drain electrode connected with the first oxide semiconductor active layer;
      a first gate electrode behind the first oxide semiconductor active layer; and
      a first gate insulating layer between the first gate electrode and the first oxide semiconductor active layer,
   wherein each of the plurality of switch oxide semiconductor TFTs includes:
      a second oxide semiconductor active layer;
      a second source electrode connected with the second oxide semiconductor active layer;
      a second drain electrode connected with the second oxide semiconductor active layer;
      a third electrode in front of the second oxide semiconductor active layer; and
      a second insulating layer between the third electrode and the second oxide semiconductor active layer, and
   wherein the controller is configured to:
      apply a predetermined voltage to the third electrodes in measuring the electrostatic charge of the measurement target;
      control the plurality of switch oxide semiconductor TFTs to select the plurality of sensor oxide semiconductor TFTs one by one;
      measure a difference from a reference current of a current flowing between the first source electrode and the first drain electrode, while applying a driving voltage to the first gate electrode of a sensor oxide semiconductor TFT selected from the plurality of sensor oxide semiconductor TFT; and
      determine intensity of an electrostatic field generated by electrostatic charge of the measurement target based on direction and amount of the difference.

9. The electrostatic sensing device according to claim 8, wherein each of the plurality of switch oxide semiconductor TFTs further includes:
   a second gate electrode behind the second oxide semiconductor active layer; and
   a second gate insulating layer between the second gate electrode and the second oxide semiconductor active layer, and wherein the controller is configured to apply a predetermined voltage to the third electrode in measuring the electrostatic charge of the measurement target.

10. The electrostatic sensing device according to claim 8, wherein each of the plurality of sensor oxide semiconductor TFTs includes:
   a conductor layer in a floating state in front of the first oxide semiconductor active layer; and
   an insulating layer between the conductor layer and the first oxide semiconductor active layer.

11. The electrostatic sensing device according to claim 8,
   wherein the third electrode of each of the plurality of switch oxide semiconductor TFTs is a part of an unseparated common conductor layer having a plurality of openings, and
   wherein the plurality of openings are located in front of the plurality of sensor oxide semiconductor TFTs for an electric field generated by the electrostatic charge of the measurement target to pass through the plurality of openings.

\* \* \* \* \*